(12) United States Patent
Lee et al.

(10) Patent No.: US 11,291,113 B2
(45) Date of Patent: Mar. 29, 2022

(54) CERAMIC SUBSTRATE AND MANUFACTURING METHOD THEREFOR

(71) Applicant: AMOSENSE CO., LTD., Cheonan-si (KR)

(72) Inventors: Ji-Hyung Lee, Pyeongtaek-si (KR); Ik-Seong Park, Gwanak-gu Seoul (KR); Hyeon-Choon Cho, Seongnam-si (KR)

(73) Assignee: Amosense Co. Ltd., Chungcheongnam-Do (KR)

( * ) Notice: Subject to any disclaimer, the term of this patent is extended or adjusted under 35 U.S.C. 154(b) by 245 days.

(21) Appl. No.: 16/306,984

(22) PCT Filed: Jun. 14, 2017

(86) PCT No.: PCT/KR2017/006207
§ 371 (c)(1),
(2) Date: Dec. 4, 2018

(87) PCT Pub. No.: WO2017/222235
PCT Pub. Date: Dec. 28, 2017

(65) Prior Publication Data
US 2020/0315003 A1 Oct. 1, 2020

(30) Foreign Application Priority Data

Jun. 21, 2016 (KR) .................. 10-2016-0077297
Aug. 30, 2016 (KR) .................. 10-2016-0111098
Oct. 5, 2016 (KR) .................. 10-2016-0128623

(51) Int. Cl.
*H05K 1/02* (2006.01)
*H05K 1/03* (2006.01)
(Continued)

(52) U.S. Cl.
CPC ..... *H05K 1/0296* (2013.01); *H01L 23/49838* (2013.01); *H05K 1/0306* (2013.01);
(Continued)

(58) Field of Classification Search
CPC .... H05K 1/0296; H05K 1/0306; H05K 3/022; H05K 3/061; H05K 3/067; H05K 3/381;
(Continued)

(56) References Cited

U.S. PATENT DOCUMENTS

2003/0224199 A1* 12/2003 Nakamura .......... H01L 23/3735
428/621
2004/0238483 A1* 12/2004 Tsukaguchi ............ H05K 3/067
216/13
2014/0291699 A1* 10/2014 Yano ................... H01L 23/3735
257/77

FOREIGN PATENT DOCUMENTS

DE 4004844 C1 1/1991
EP 1370123 A2 12/2003
(Continued)

OTHER PUBLICATIONS

Extended Search Report issued in European Application No. 17815648.5, dated Jun. 4, 2019.

*Primary Examiner* — Ishwarbhai B Patel
(74) *Attorney, Agent, or Firm* — BakerHostetler

(57) ABSTRACT

A ceramic substrate is provided in which an inclined protrusion is formed on boundary surface of a metal layer bonded to a ceramic base so as to increase bonding strength; and a manufacturing method therefor. The inclined protrusion may include: a tapered protrusion and a multi-stepped protrusion formed on the boundary surface of the metal layer according to an interval between the metal layer bonded to the ceramic base and a neighboring metal layer, wherein a multi-stepped protrusion having an inclination angle within a predetermined angle range with respect to the ceramic base (Continued)

may be formed on the boundary surface of the metal layer where stress is concentrated, such as the short edge, apex, corner, and the like, and a tapered protrusion may be formed on a remaining portion of the boundary surface of the metal layer.

16 Claims, 24 Drawing Sheets

(51) Int. Cl.
  *H01L 23/498* (2006.01)
  *H05K 3/02* (2006.01)
  *H05K 3/06* (2006.01)
  *H05K 3/38* (2006.01)

(52) U.S. Cl.
  CPC ............. *H05K 3/022* (2013.01); *H05K 3/061* (2013.01); *H05K 3/067* (2013.01); *H05K 3/381* (2013.01); *H05K 2201/09827* (2013.01)

(58) Field of Classification Search
  CPC ......... H05K 2201/09827; H05K 3/388; H05K 1/0271; H05K 3/0079; H05K 2203/0346; H05K 2203/0528; H05K 2203/0789; H01L 23/49838
  See application file for complete search history.

(56) References Cited

FOREIGN PATENT DOCUMENTS

| | | | |
|---|---|---|---|
| EP | 1482771 | A2 | 12/2004 |
| JP | 10-93211 | A | 4/1998 |
| JP | 11322455 | A | 11/1999 |
| JP | 2001-267447 | A | 9/2001 |
| JP | 2002-353625 | A | 12/2002 |
| JP | 2004-014589 | A | 1/2004 |
| JP | 2004-307307 | A | 11/2004 |
| JP | 2013-93355 | A | 5/2013 |
| KR | 2010-0068593 | A | 6/2010 |
| KR | 20130050092 | A * | 5/2013 |
| KR | 20130050092 | A | 5/2013 |

\* cited by examiner

|  | first ceramic AMB substrate | second ceramic AMB substrate | third ceramic AMB substrate | fourth ceramic AMB substrate |
|---|---|---|---|---|
| ceramic base | ZTA 9% | AlN | Al2O3 | ZTA 15% |
| ceramic base thickness | 0.32 | 0.635 | 0.5 | 0.32 |
| metal layer | ETP | OFC | OFC | OFC |
| metal layer thickness | 0.3 | 0.3 | 0.3 | 0.3 |

FIG. 21

| ceramic substrate | classification | 200 Cycles | 300 Cycles | 400 Cycles | 500 Cycles | 600 Cycles |
|---|---|---|---|---|---|---|
| first ceramic AMB substrate | dimple type | | | | | |
| | tapered type | | | | | |
| | 1-Step | | | | | |
| | 2-Step | | | | | |

FIG. 22

| ceramic substrate | classi-fication | 200 Cycles | 300 Cycles | 400 Cycles | 500 Cycles | 600 Cycles |
|---|---|---|---|---|---|---|
| second ceramic AMB substrate | dimple type | | | | | |
| | tapered type | | | | | |
| | 1-Step | | | | | |
| | 2-Step | | | | | |

CERAMIC SUBSTRATE AND MANUFACTURING METHOD THEREFOR

CROSS-REFERENCE TO RELATED APPLICATIONS

This application is a National Stage of International patent application PCT/KR2017/006207, filed on Jun. 14, 2017, which claims priority to foreign Korean patent application Nos. KR 10-2016-0077297, filed on Jun. 21, 2016, 10-2016-0111098, filed on Aug. 30, 2016, and 10-2016-0128623, filed on Oct. 5, 2016, the disclosures of which are incorporated by reference in their entireties.

FIELD OF THE INVENTION

The present invention relates to a ceramic substrate and a manufacturing method therefor. More particularly, the present invention relates to a ceramic substrate and a manufacturing method therefor, in which a bonding state between a ceramic base and a metal film is firmly maintained even under a rapid temperature change.

BACKGROUND

As well known in the art, a ceramic substrate is formed by integrally bonding a metal foil such as a copper foil to a ceramic base. The ceramic substrate is manufactured through manufacturing processes such as active metal brazing (AMB) and direct bond copper (DBC), and the like and may be classified into a ceramic AMB substrate, a ceramic DBC substrate, and the like depending on the manufacturing process.

Such a ceramic AMB substrate is manufactured through active metal brazing (AMB), which is a form of brazing which allows metal to be directly joined to the surface of the ceramic base without conducting metallization on the surface of the ceramic base.

The ceramic AMB substrate exhibits high heat dissipation characteristics and reliability and thus finds application in various fields, such as vehicles, wind turbines, high voltage DC transmission, and the like.

A ceramic AMB substrate according to the related art (hereinafter, referred to as a basic ceramic AMB substrate) is formed by brazing metal such as copper and the like on the surface of a ceramic base to form a metal layer, positioning a mask (for example, a dry film) on the surface of the metal layer, and then etching a predetermined portion of the boundary surface of the metal layer with an etching solution.

Herein, the basic ceramic AMB substrate is shaped such that the boundary surface of the metal layer is gradually inclined inwardly from an upper to a lower edge thereof. Because of this, when a rapid temperature change occurs, cracks may occur in the metal layer or delamination of the metal layer from the ceramic base may occur.

As an example, when a thermal shock test (test conditions: ceramic substrate material: alumina, ZTA (HPS), AlN, 1 cycle: about 30 minutes, and temperature change: from −50° C. to 150° C.) is conducted to measure characteristics of the ceramic AMB substrate, internal cracks and delamination occur at about 100 cycles.

The ceramic AMB substrate is mainly used as a power electronic substrate and thus is required to have a long lifespan. To delay the occurrence of internal cracks and delamination, application of $Si_3N_4$ and SiC, which have high strength, to the ceramic substrate has been considered.

However, such $Si_3N_4$ and SiC have high strength but are costly, leading to an increase in product cost and thus a decrease in product competitiveness.

Accordingly, there has been developed a dimple-type ceramic AMB substrate having multiple dimples (or holes) formed along the boundary surface of the metal layer while using a conventional ceramic material.

Such a dimple-type ceramic AMB substrate is manufactured by brazing metal such as copper and the like on the surface of a ceramic substrate to form a metal layer, positioning a mask having multiple dimples on the surface of the metal layer, and then etching a predetermined portion of the boundary surface of the metal layer and hole portions with an etching solution.

Accordingly, the dimple-type ceramic AMB substrate having the multiple dimples formed along the boundary surface of the metal layer can be prevented from cracking and delamination of the metal layer even under a rapid temperature change.

However, the dimple-type ceramic AMB substrate is problematic in that formation of the multiple dimples may lead to a decreased area of the metal layer, thus leading to a degradation in electrical characteristics such as electric conductivity, thermal resistance, and the like. In other words, the electrical characteristics of the ceramic AMB substrate are proportional to the area of the metal layer, and thus in the dimple-type ceramic AMB substrate, the metal layer may decrease in area due to the multiple dimples formed along the boundary surface of the metal layer, leading to deteriorated electrical characteristics.

Furthermore, the dimple-type ceramic AMB substrate is also problematic in that when the dimples are formed only in a part of the metal layer in order to prevent the deterioration in electrical characteristics, a part of the metal layer having no dimples may undergo cracking or delamination from the ceramic base.

Furthermore, the dimple-type ceramic AMB substrate is still problematic in that the dimples has a high area ratio, leading to an increase in resistance and a decrease in strength and in bonding strength between the ceramic base and the metal layer, thereby failing to satisfy the electrical characteristics required according to application purpose.

Furthermore, the dimple-type ceramic AMB substrate does not find application in forming of a micro-scale pattern due to the high area ratio of the dimples.

SUMMARY OF THE INVENTION

Accordingly, the present invention has been made keeping in mind the above problems occurring in the related art, and an objective of the present invention is to provide a ceramic substrate and a manufacturing method therefor, in which an inclined protrusion is formed on the boundary surface of a metal layer bonded to a ceramic base, thus increasing the bonding strength.

Another objective of the present invention is to provide a ceramic substrate and a manufacturing method therefor, in which a tapered protrusion and a multi-stepped protrusion are formed on the boundary surface of a metal layer according to an interval between the metal layer bonded to a ceramic base and a neighboring metal layer, thus increasing the bonding strength.

Still another objective of the present invention is to provide a ceramic substrate and a manufacturing method therefor, in which an inclined protrusion, which has an inclination angle within a predetermined angle range with a ceramic base, is formed on a portion of the boundary surface of a metal layer where stress is concentrated, such as a short edge, an apex, a corner, and the like, thus increasing the bonding strength.

Technical Solution

In order to accomplish the above objectives, according to one aspect of the present invention, there is provided a ceramic substrate, including: a ceramic base and; a metal layer bonded to at least one surface of the ceramic base, wherein the metal layer has an inclined protrusion formed on a boundary surface thereof.

Herein, the metal layer may be bonded to the surface of the ceramic base through brazing or may be bonded to the ceramic base through a bonding layer interposed between the ceramic base and the metal layer to bond the ceramic base and the metal layer to each other.

The inclined protrusion may inclinedly extend from an upper edge of the metal layer to protrude toward an outside end of the ceramic base through a virtual line which is perpendicular to the ceramic substrate. Herein, the inclined protrusion may increase in protruding length toward the ceramic base and may be formed in a shape concaved toward the ceramic base.

The inclined protrusion may be formed to have a protruding length toward the ceramic base, the protruding length being shorter than a thickness of the metal layer.

The inclined protrusion may have multiple concave portions and may have a protrusion formed at a portion where each of the concave portions and a neighboring concave portion are in contact with each other.

A ceramic substrate according to another embodiment of the present invention may include a ceramic base and a metal layer bonded to at least one surface of the ceramic base and having an inclined protrusion including a tapered protrusion and a multi-stepped protrusion. An interval between the boundary surface of the metal layer on which the tapered protrusion is formed and a neighboring metal layer may be smaller than an interval between the boundary surface of the metal layer on which the multi-stepped protrusion is formed and the neighboring metal layer.

Herein, when an interval between the metal layer and a neighboring metal layer is greater than a maximum set interval, a multi-stepped protrusion may be formed on a portion of the boundary surface of the metal layer, the portion of the boundary surface facing the neighboring metal layer, and when an interval between the metal layer and a neighboring metal layer is less than a minimum set interval, a tapered protrusion may be formed on a portion of the boundary surface of the metal layer, the portion of the boundary surface facing the neighboring metal layer.

When an interval between the metal layer and a neighboring metal layer ranges from equal to or greater than a minimum set interval to equal to or less than a maximum set interval, a tapered protrusion or multi-stepped protrusion may be formed on a portion of the boundary surface of the metal layer, the portion of the boundary surface facing the neighboring metal layer, wherein when the tapered protrusion is formed on the neighboring metal layer, the multi-stepped protrusion may be formed on the portion of the boundary surface of the metal layer, the portion of the boundary surface facing the neighboring metal layer, and when the multi-stepped protrusion is formed on the neighboring metal layer, the tapered protrusion may be formed on the portion of the boundary surface of the metal layer, the portion of the boundary surface facing the neighboring metal layer.

A ceramic substrate according to still another embodiment of the present invention may include a ceramic base and a metal layer bonded to at least one surface of the ceramic base and having an inclination protrusion including a multi-stepped protrusion formed on a portion of a boundary surface of the metal layer where stress is concentrated.

The multi-stepped protrusion may be formed on the portion of the boundary surface of the metal layer at a position corresponding to at least one of a short edge, a corner, and an apex. Herein, the multi-stepped protrusion may have an inclination angle ranging from equal to or greater than 27° to equal to or less than 33°, and the inclination angle may be an angle between the surface of the ceramic base and a line connecting a point where the multi-stepped protrusion is in contact with the ceramic base and an apex of a protrusion formed between concave portions.

Meanwhile, the inclined protrusion may further include a tapered protrusion formed on a remaining portion of the boundary surface of the metal layer. Herein, the tapered protrusion may have an inclination angle ranging from equal to or greater than 27° to equal to or less than 33°, and the inclination angle may be an angle between the surface of the ceramic base and a line connecting two points where the tapered protrusion is in contact with the metal layer and the ceramic base. Herein, the inclined protrusion may have a curved inclination.

According to another aspect of the present invention, there is provided a manufacturing method for a ceramic substrate, the method including: preparing a ceramic base; forming a metal layer on at least one surface of the ceramic base; forming a mask on the surface of the ceramic base; and forming an inclined protrusion by etching a portion of the metal layer exposed by the mask.

Forming the inclined protrusion may include: forming an inclined protrusion inclinedly extending from an upper edge of the metal layer to protrude toward an outside end of the ceramic base through a virtual line which is perpendicular to the ceramic substrate.

Multiple masks arranged to be spaced apart from each other may be used in forming the mask, an inclined protrusion including a tapered protrusion and a multi-stepped protrusion may be formed in forming the inclined protrusion, and an interval between a boundary surface of the metal layer on which the tapered protrusion is formed and a neighboring metal layer may be smaller than an interval between the boundary surface of the metal layer on which the multi-stepped protrusion is formed and the neighboring metal layer.

Herein, forming the inclined protrusion may include: forming a multi-stepped protrusion on a portion of a boundary surface of the metal layer where stress is concentrated, wherein forming the multi-stepped protrusion may include: forming a multi-stepped protrusion having multiple concave portions formed on the boundary surface of the metal layer at a position corresponding to at least one of a short edge, a corner, and an apex; and forming a multi-stepped protrusion having an inclination angle ranging from equal to or greater than approximately 27° to equal to or less than 33° with respect to the ceramic base, and the inclination angle may be an angle between the surface of the ceramic base and a line connecting a point where the multi-stepped protrusion is contact with the ceramic base and a protrusion formed between concave portions.

According to the present invention, the ceramic substrate and the manufacturing method thereof according to the embodiment of the present invention are advantageous over a dimple-type ceramic AMB substrate according to the related art in that the metal layer is increased in area, leading to improvement in electric characteristics such as electric conductivity, thermal resistance, and the like while realizing the same level of crack resistance and delamination resistance as the dimple-type ceramic AMB substrate according to the related art.

Furthermore, the ceramic substrate and the manufacturing method thereof according to the embodiment of the present invention are advantageous over the dimple-type ceramic AMB substrate according to the related art in that the ceramic substrate has a relatively large area Because of this, when electrical characteristics thereof are the same, it is possible to realize relatively high crack and delamination resistance.

Furthermore, the ceramic substrate and the manufacturing method thereof according to the embodiment of the present invention are advantageous over the dimple-type ceramic AMB substrate according to the related art in that the ceramic substrate has a relatively large area, making it possible to strongly maintain the strength and bonding strength and find application in forming of a micro-scale pattern.

Furthermore, the ceramic substrate and the manufacturing method thereof according to the embodiment of the present invention are advantageous over the dimple-type ceramic AMB substrate according to the related art in terms of securing reliability while providing a prolonged lifespan.

Furthermore, in the ceramic substrate and the manufacturing method therefor according to the embodiment of the present invention, controlling an etching pattern of the mask (that is, a dry film) is possible upon forming the inclined protrusion, thus making it unnecessary to perform additional etching two or three times and thus leading to a reduction in post-processing cost.

Furthermore, in the ceramic substrate and the manufacturing method therefor according to the embodiment of the present invention, forming the inclined protrusion in the metal makes it possible to disperse energy on the boundary surface of the metal layer, thus improving long-term reliability of an AMB insulated gate bipolar mode transistor (IGBT) substrate.

BRIEF DESCRIPTION OF THE DRAWINGS

Figure 24:
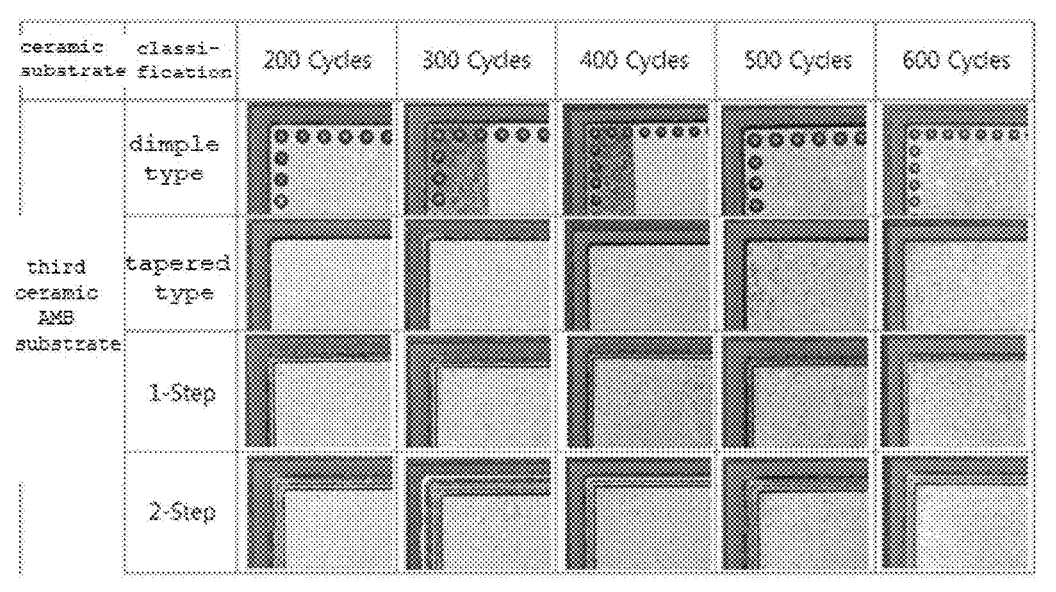

FIGS. 21 to 25 are views showing comparison between a dimple-type ceramic AMB substrate according to the related art and the ceramic substrate according to the embodiment of the present invention.

DETAILED DESCRIPTION

Figure 1:
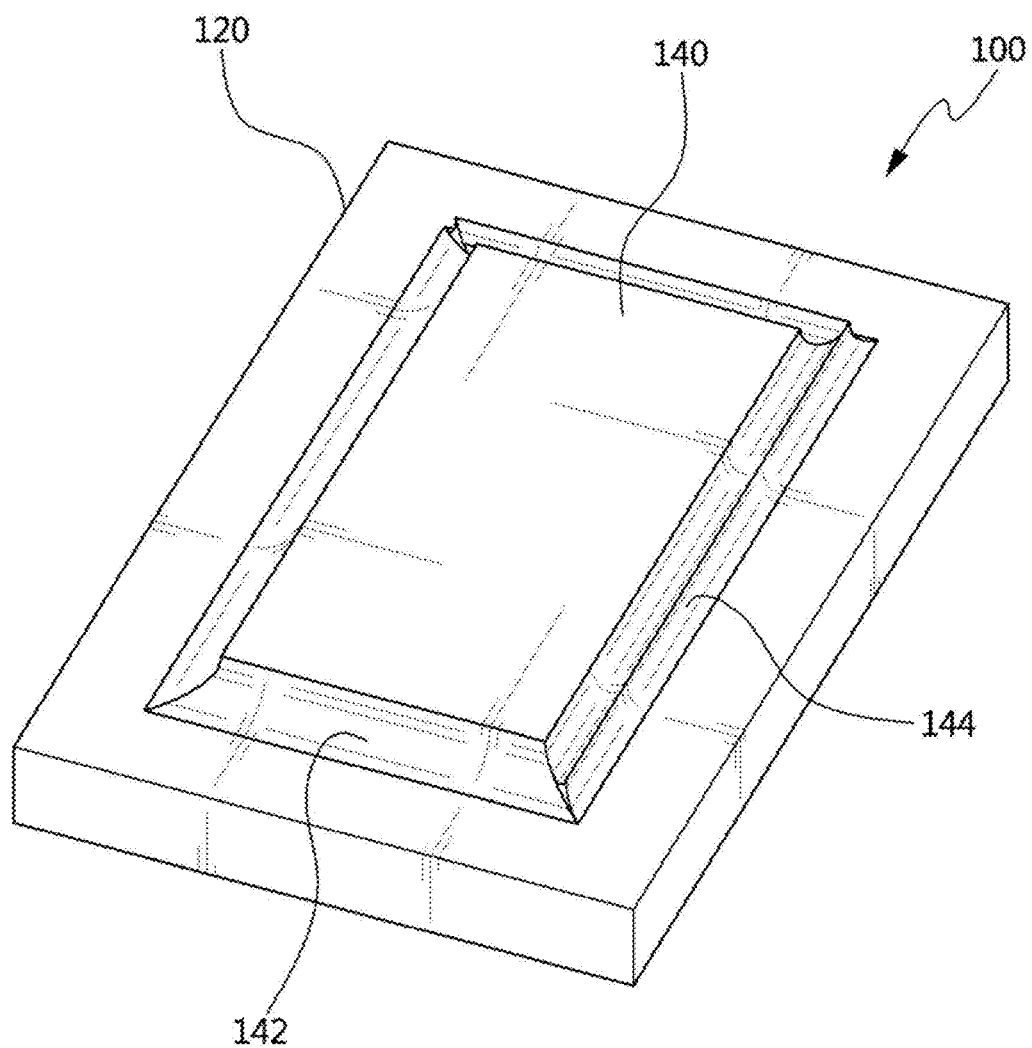
FIG. 1 is a view showing a ceramic substrate according to an embodiment of the present invention.

A ceramic substrate according to an embodiment of the present invention includes a ceramic base and a metal layer bonded to at least one surface of the ceramic base, wherein the metal layer has an inclined protrusion formed on a boundary surface thereof.

Hereinbelow, exemplary embodiments of the present invention will be described in detail with reference to the accompanying drawings such that the invention can be easily embodied by one of ordinary skill in the art to which this invention belongs. Reference now should be made to the drawings, in which the same reference numerals are used throughout the different drawings to designate the same or similar components. In the following description, it is to be noted that, when the functions of conventional elements and the detailed description of elements related with the present invention may make the gist of the present invention unclear, a detailed description of those elements will be omitted.

Referring to FIG. 1, a ceramic substrate 100 according to an embodiment of the present invention includes a ceramic base 120 and a metal layer 140.

The ceramic base 120 is made of a ceramic material such as zirconia toughened alumina (ZTA), aluminum nitride (AlN), aluminum oxide (alumina, $Al_2O_3$), silicon nitride (SiN, $Si_3N_4$). The ceramic base 120 may be made of a synthetic ceramic material including at least one of ZTA, aluminum nitride, aluminum oxide, and silicon nitride.

For example, the ceramic base 120 may be formed to have a composition ratio of ZTA of approximately 9% or 15% and at least one of aluminum nitride, aluminum oxide, and silicon nitride of approximately 91% or 85%.

In a modified embodiment, the ceramic base 120 may be made of a ceramic material that is applicable to a power module and the like.

The ceramic base 120 may be formed to have a thickness of approximately 0.32 mm to 0.635 mm according to the composition ratio. Herein, to enhance a bonding force with the metal layer 140, the ceramic base 120 may have fine protrusions formed by performing chemical treatment or physical grinding on the surface thereof.

The metal layer 140 is made of a metal thin film. Herein, the metal layer 140 may be made of a copper foil. The metal layer 140 may be made of a metal thin film or mixed metal thin film containing any one of copper (Cu) powder, silver (Ag) powder, aluminum (Al) powder, nickel (Ni) powder, tin (Sn) powder, and phosphorus (P) powder. The metal layer 140 may be made of a mixed metal thin film such as TiCu, NiTi, NiNb, CuMo, TiAg, and the like.

The metal layer 140 is bonded to the at least one surface of the ceramic base 120. In other words, the metal layer 140 is directly bonded to the surface of the ceramic base 120 through brazing. Herein, the metal layer 140 may be bonded to the ceramic base 120 through a bonding layer interposed between the metal layer and the ceramic base 120.

The metal layer 140 is formed to be smaller in area than the ceramic base 120. The metal layer 140 is configured such that a boundary surface thereof is spaced apart from a boundary surface of the ceramic base 120 by a predetermined interval so as to be bonded inwardly to the surface of the ceramic base 120.

The metal layer 140 may have inclined protrusions 142 and 144 formed on the boundary surface thereof. The inclined protrusions 142 and 144 may include a tapered protrusion 142 and a multi-stepped protrusion 144. Accordingly, the metal layer 140 may have at least one of the tapered protrusion 142 and the multi-stepped protrusion 144 extending from the boundary surface thereof.

Figure 2:
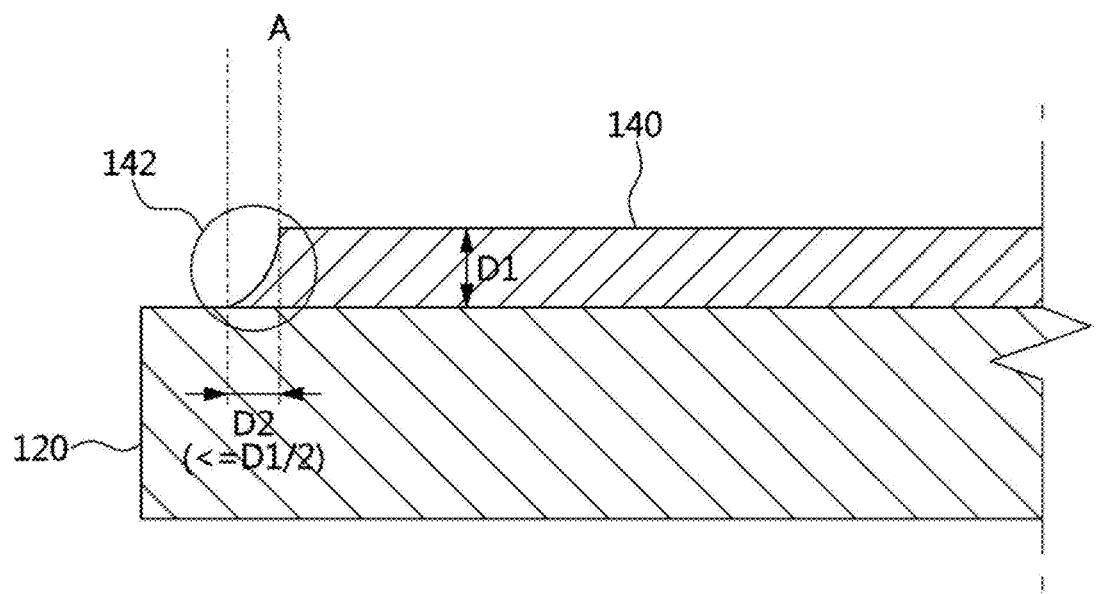
FIGS. 2 to 10 are views showing a metal layer of FIG. 1.

As shown in FIG. 2, the metal layer 140 has the inclined protrusion inclinedly extending downward from the upper to the lower edge thereof toward the outside end of the ceramic base 120, more specifically, has the tapered protrusion 142.

The tapered protrusion 142 inclinedly extends from the upper edge of the metal layer 140 to protrude toward the outside end of the ceramic base 120 through a virtual line A which is perpendicular to the ceramic base 120. The tapered protrusion 142 may be formed in a shape concaved toward the ceramic base 120 to have a curved inclination.

Herein, the tapered protrusion 142 increases in protruding length toward the boundary surface of the ceramic base 120, and a total protruding length D2 thereof may be shorter than a thickness D1 of the metal layer 140. More specifically explained, the tapered protrusion 142 may have the protruding length D2 equal to or less than approximately one half of the thickness D1 of the metal layer 140. Herein, it is preferable that the tapered protrusion 142 has the length D2 of equal to or less than approximately one half of the thickness D1 of the metal layer 140.

The tapered protrusion 142 is relatively narrower than the multi-stepped protrusion 144 and thus has a low bonding strength, but a protruding area thereof toward the outside end of the ceramic base is small, thus making it possible to maintain the bonding strength even when an interval between metal layers 140 is small.

Figure 3:
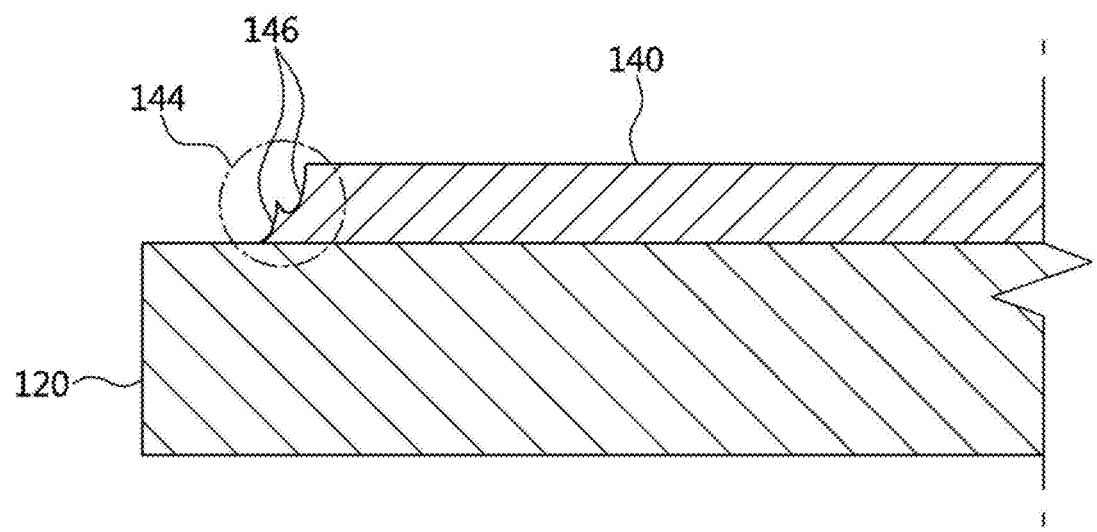
Figure 4:
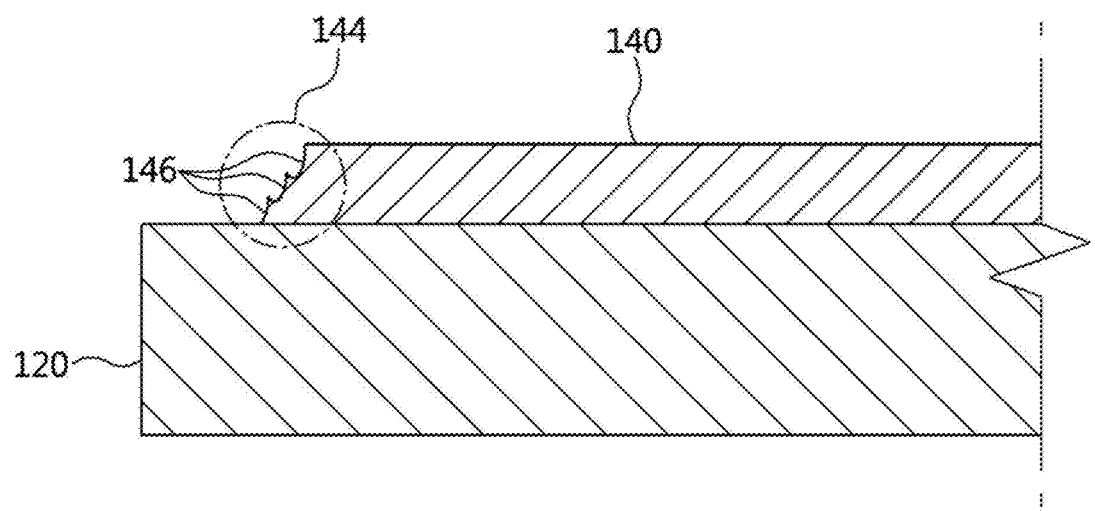

As shown in FIGS. 3 to 4, the metal layer 140 may have the inclined protrusion having multiple concave portions 146, more specifically, may have the multi-stepped protrusion 144. The multi-stepped protrusion 144 may be configured such that multiple concave portions 146 are formed thereon to form multiple steps. The multi-stepped protrusion 144 extends from the upper edge of the metal layer 140 to protrude toward the outside end of the ceramic base 120 through the virtual line A which is perpendicular to the ceramic base 120.

As shown in FIG. 3, the metal layer 140 may have a multi-stepped protrusion 144 having two steps formed by two concave portions 146. As shown in FIG. 4, the metal layer 140 may have a multi-stepped protrusion 144 having three steps formed by three concave portions 146 and may have a multi-stepped protrusion 144 having multiple concave portions 146 although not shown in the drawings. Herein, the multi-stepped protrusion 144 may have a pointed protrusion formed at a portion where each concave portion 146 and a neighboring concave portion 146 are in contact with each other.

Herein, the multi-stepped protrusion 144 is relatively larger than the tapered protrusion 142 in bonding area with the ceramic base 120 and thus strongly maintains the bonding strength, but a protruding area thereof toward the outside end of the ceramic base is large. Thus, when the interval between the metal layers 140 is small, the multi-stepped protrusion may be difficult to apply.

Figure 5:
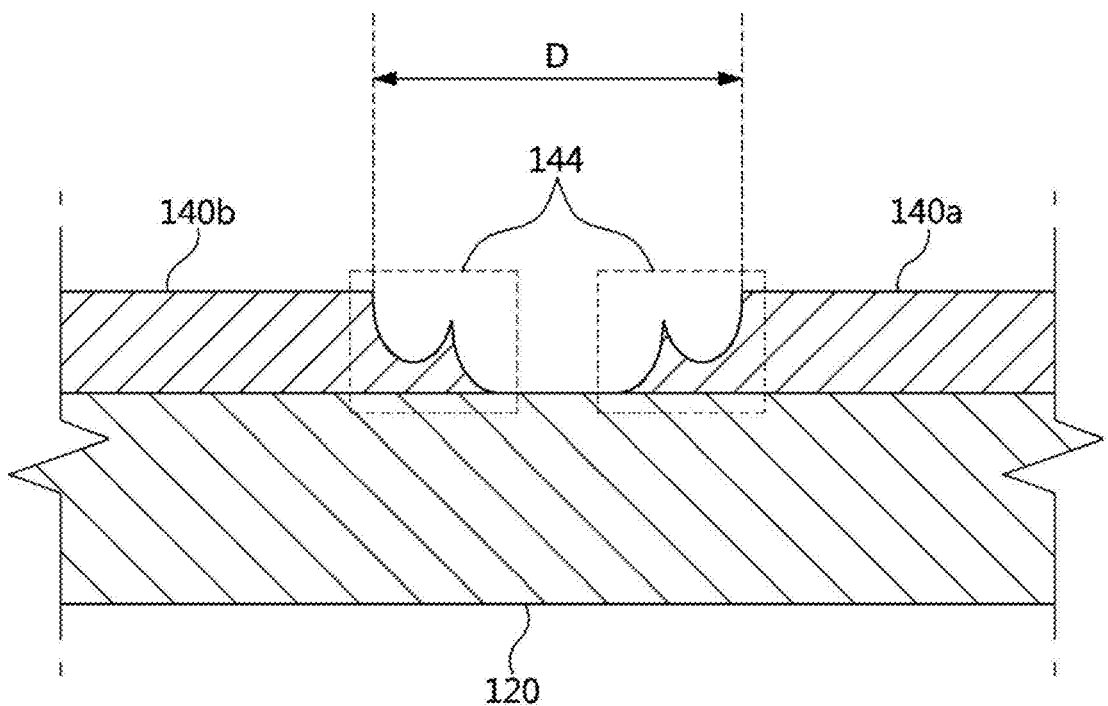
Figure 6:
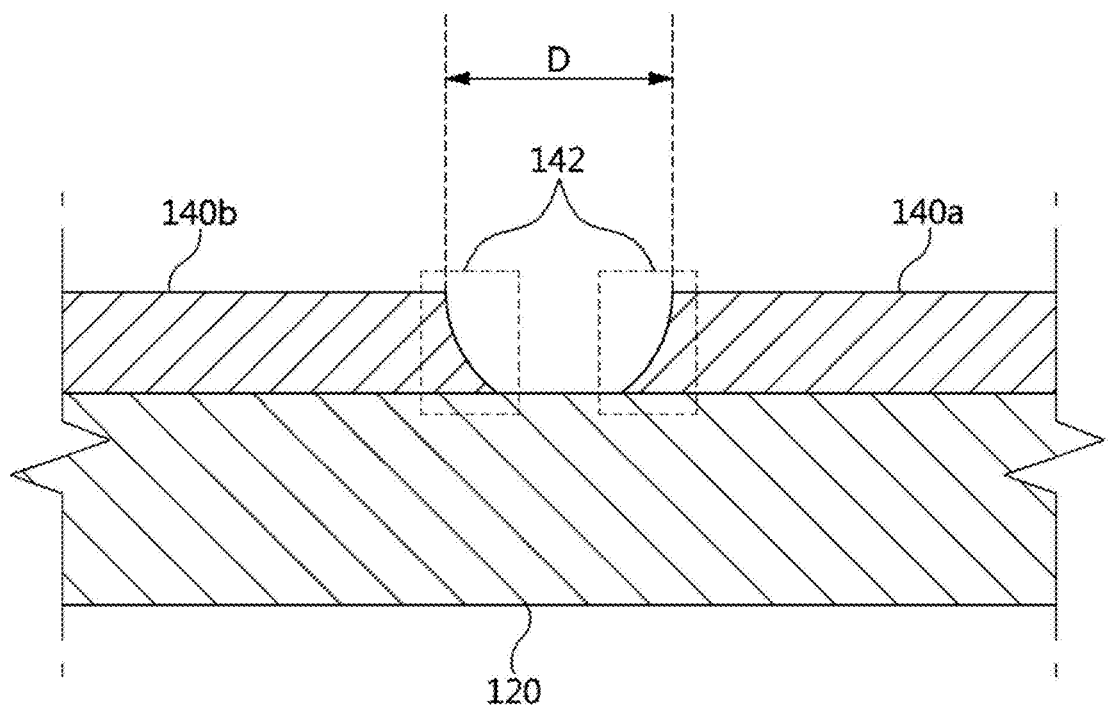
Figure 7:
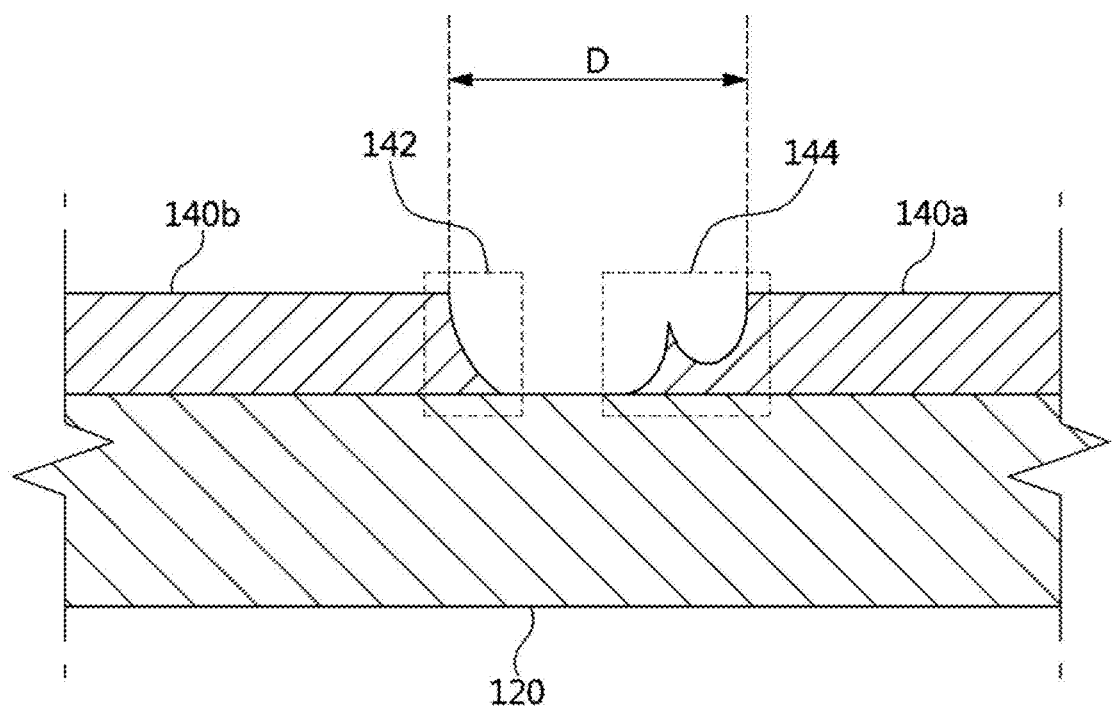

Furthermore, as shown in FIGS. 5 to 7, the metal layer 140 and a neighboring metal layer 140 may have different protrusions (that is, the tapered protrusion 142 and the multi-stepped protrusion 144) formed on facing portions of the boundary surfaces thereof, depending on the interval between the metal layers 140.

Referring to FIG. 5, when an interval D between a metal layer 140a and a neighboring metal layer 140b is greater than a maximum set interval, each of the metal layer 140a and the different metal layer 140b may have the multi-stepped protrusion 144 formed on each of the facing portions of the boundary surfaces thereof.

Referring to FIG. 6, when the interval D between the metal layer 140a and the neighboring metal layer 140b is less than a minimum set interval, each of the metal layer 140a and the neighboring metal layer 140b may have the tapered protrusion 142 formed on each of the facing portions of the boundary surfaces thereof.

Referring to FIG. 7, when the interval D between the metal layer 140a and the neighboring metal layer 140b ranges from equal to or greater than the minimum set interval to equal to or less than the maximum set interval, the tapered protrusion 142 or the multi-stepped protrusion 144 is formed on each of the facing portions of the boundary surfaces thereof. When the interval between the metal layer 140a and the neighboring metal layer 140b ranges from equal to or greater than the minimum set interval to equal to or less than the maximum set interval, and when the tapered protrusion 142 is formed on the neighboring metal layer 140b, the multi-stepped protrusion 144 may be formed on the metal layer 140a. When the multi-stepped protrusion 144 is formed on the neighboring metal layer 140b, the tapered protrusion 142 may be formed on the portion of the boundary surface of the metal layer, the portion of the boundary surface facing the neighboring metal layer 140b.

Figure 8:
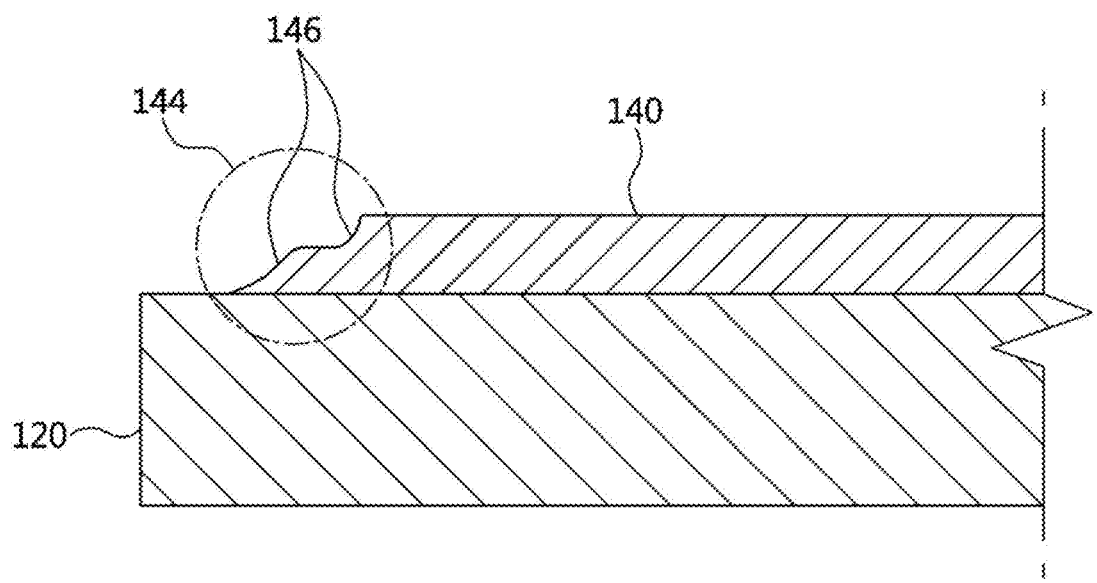

The metal layer 140 increases in bonding stress with the ceramic base 120 as the boundary surface of the metal layer increases in thickness. If the bonding stress increases, the metal layer 140 may be delaminated from the ceramic base 120 under a rapid temperature change. Thus, in order to prevent delamination of the metal layer 140 from the ceramic base 120, the bonding stress must be minimized while the bonding strength is maintained. Because of this, as shown in FIG. 8, a multi-stepped protrusion 144, which has an inclination angle within a predetermined angle range with respect to the ceramic base 120, may be formed on a portion of the boundary surface of the metal layer 140 where the stress is concentrated, thus achieving a minimized thickness. The multi-stepped protrusion 144 may be formed on the boundary surface of the metal layer 140 at a position corresponding to at least one of a short edge, a corner, and an apex.

Herein, as an example, the inclination angle may be an angle between the surface of the ceramic base 120 and a line connecting two points where the multi-stepped protrusion 144 is in contact with the metal layer 140 and the ceramic base 120 and, more specifically, an angle between the surface of the ceramic base 120 and a line connecting a point where the multi-stepped protrusion 144 is in contact with the ceramic base 120 and an apex of the protrusion formed between the concave portions 146.

Figure 9:
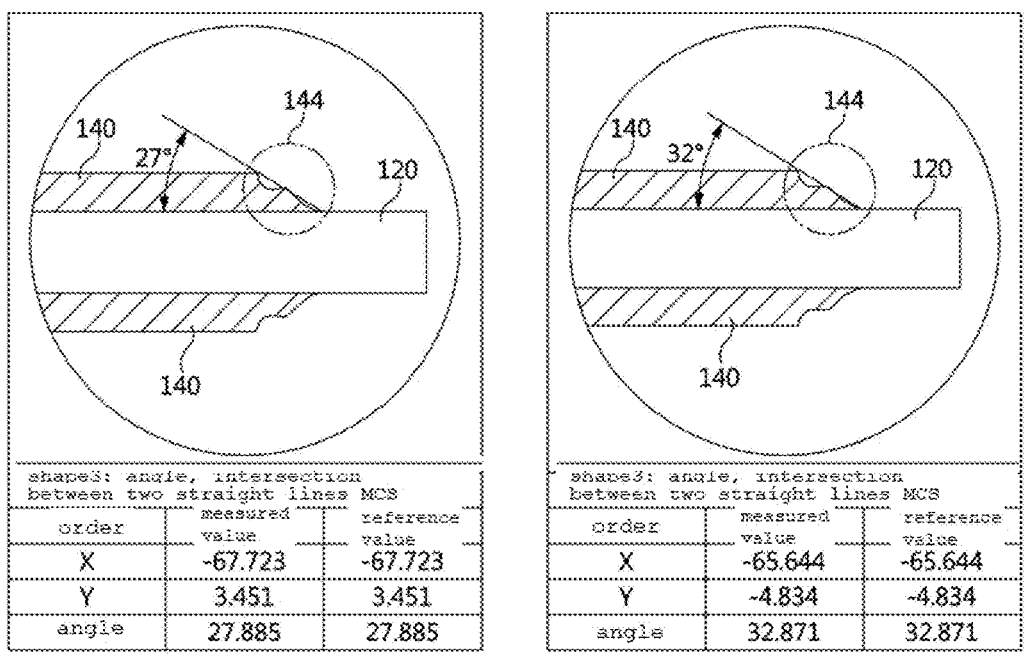

Herein, referring to FIG. 9, to minimize the bonding stress, the multi-stepped protrusion 144 is formed to have an inclination angle θ of equal to or less than approximately 33° with respect to the ceramic base 120. In this case, if the inclination angle is set to be too low, the bonding strength may decrease, causing the multi-stepped protrusion 144 to be delaminated from the ceramic base 120. Accordingly, to minimize the bonding stress, it is preferable that the multi-stepped protrusion 144 is formed to have an inclination angle θ ranging from equal to or greater than approximately 27° to equal to or less than 33° with respect to the ceramic base 120.

Figure 10:
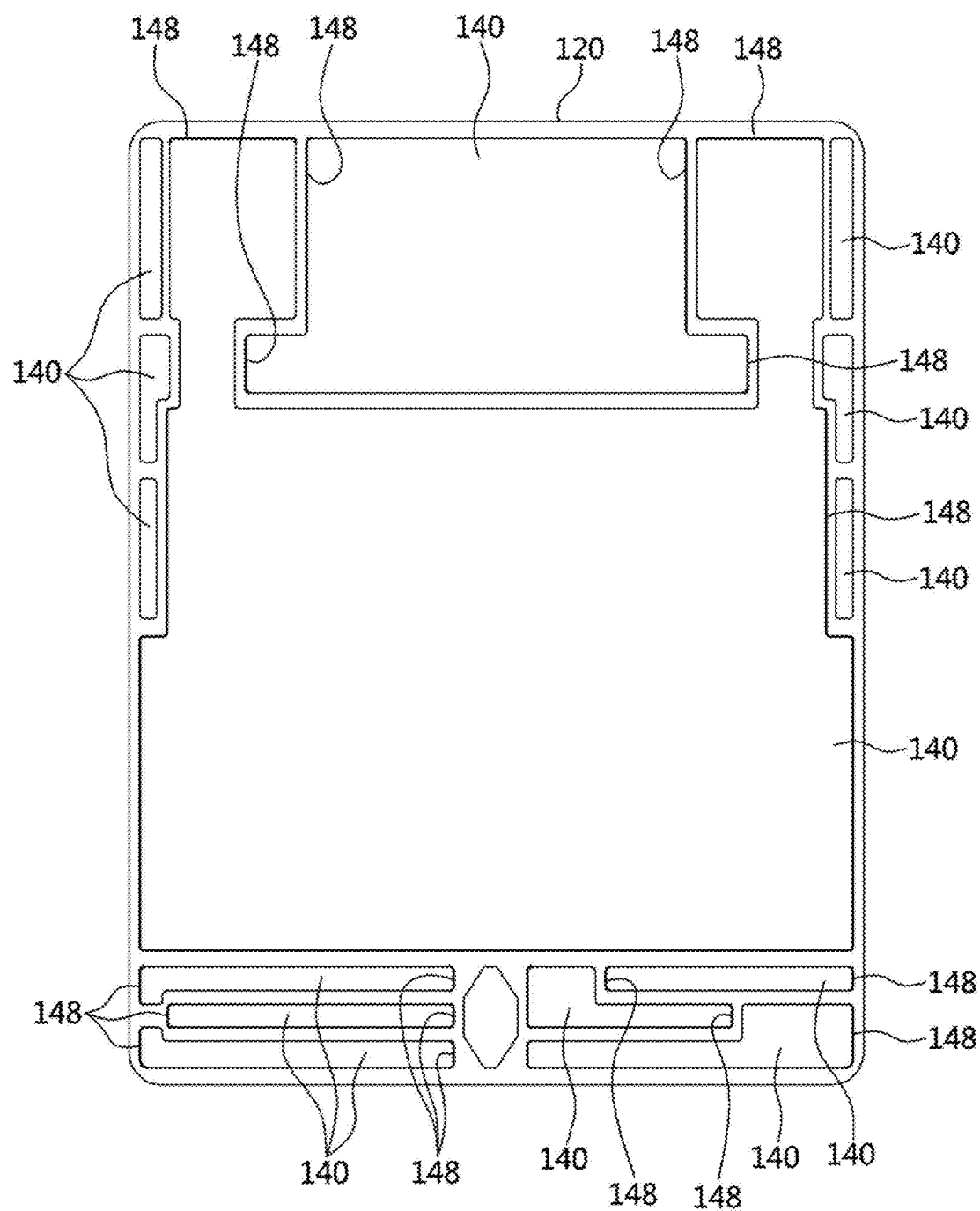

Meanwhile, referring to FIGS. 9 and 10, the metal layer 140 may have at least one inclined protrusion formed on a portion 148 of the boundary surface thereof where the bonding stress is concentrated.

In other words, the bonding stress is concentrated on portions 148 of the metal layer 140, such as the short edge, the apex, the corner, and the like. Because of this, the multi-stepped protrusion 144 being relatively thin may be formed on the portion of the boundary surface of the metal layer 140 at a position corresponding to the short edge, the apex, the corner, and the like, while the tapered protrusion 142 may be formed on a remaining portion of the boundary surface of the metal layer.

Herein, the tapered protrusion 142 and the multi-stepped protrusion 144 may be formed to have an inclination angle within a predetermined angle range (for example, ranging from equal to or greater than approximately 27° to equal to or less than 33°) with respect to the ceramic base 120.

Herein, the inclination angle may be an angle between the surface of the ceramic base 120 and a line connecting two points where the tapered protrusion 142 is in contact with the metal layer 140 and the ceramic base 120 or an angle between the surface of the ceramic base 120 and a line connecting a point where the multi-stepped protrusion 144 is in contact with the ceramic base 120 and an apex of the protrusion formed between the concave portions 146.

Figure 11:
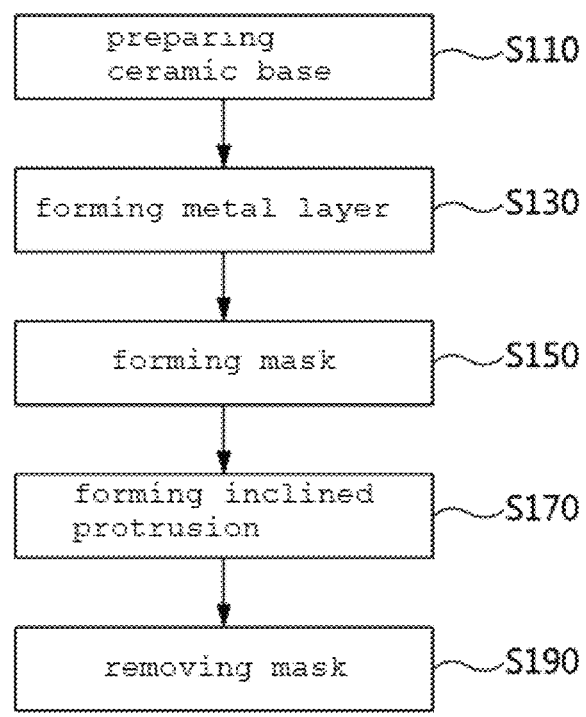
FIGS. 11 and 12 are views showing a manufacturing method for a ceramic substrate according to a first embodiment of the present invention.
Figure 12:
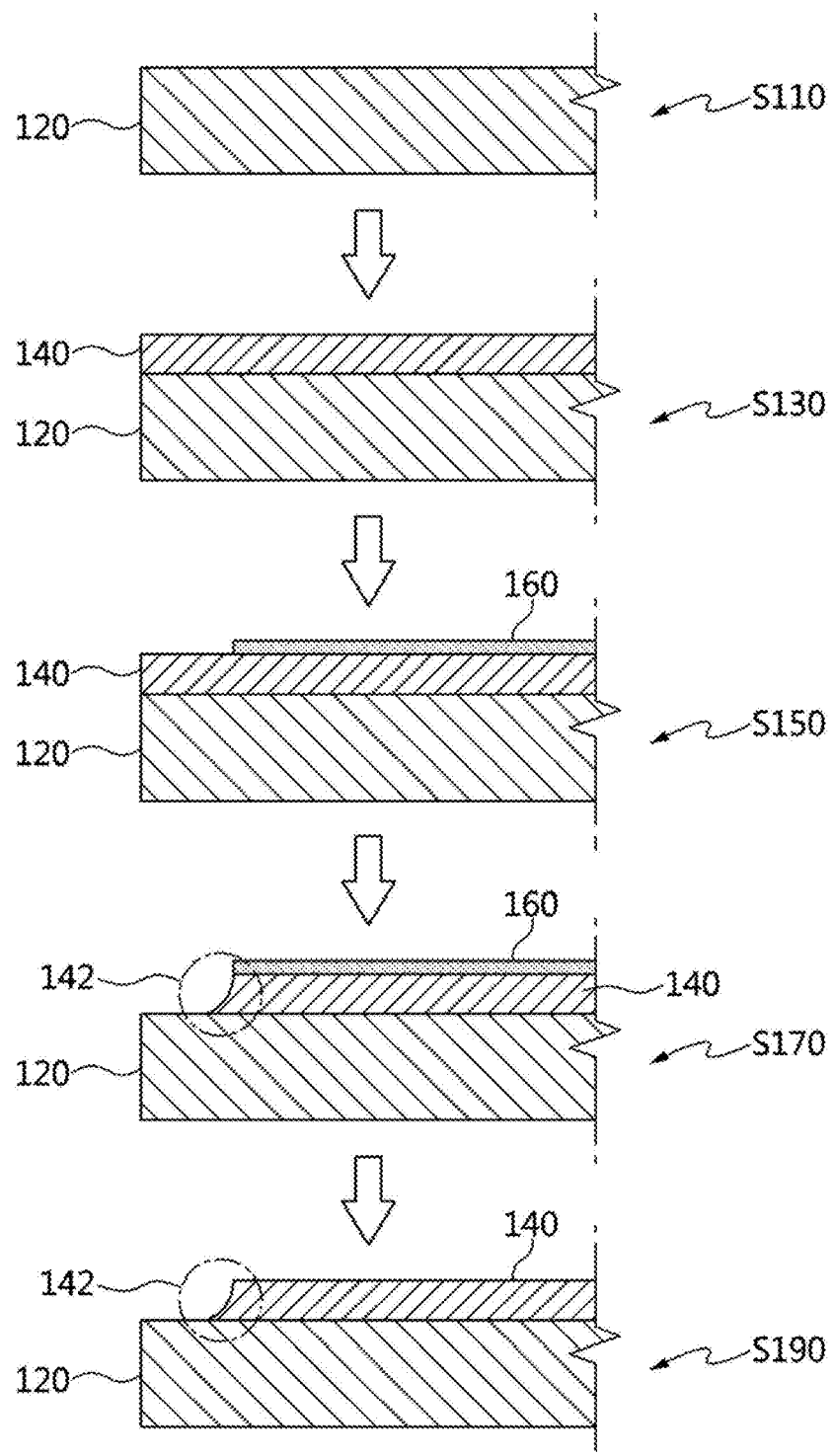

Referring to FIGS. 11 and 12, a manufacturing method for a ceramic substrate according to a first embodiment of the present invention includes preparing a ceramic base 120 (S110), forming a metal layer 140 (S130), forming a mask 160 (S150), forming an inclined protrusion 142 (S170), and removing the mask 160 (S190).

In preparing the ceramic base 120 (S110), the ceramic base 120 made of one of ceramic materials, including ZTA, aluminum nitride, aluminum oxide (alumina), and silicon nitride is prepared. Herein, in preparing the ceramic base 120 (S110), the ceramic base may be made of a synthetic ceramic material including at least one of ZTA, aluminum nitride, aluminum oxide, and silicon nitride.

For example, in preparing the ceramic base 120 (S110), a ceramic base 120, which has a composition ratio of ZTA of approximately 9% or 15% and at least one of aluminum nitride, aluminum oxide, and silicon nitride of approximately 91% or 85%, is prepared.

In preparing the ceramic base 120 (S110), a ceramic base 120 having a thickness of approximately 0.32 mm to 0.635 mm is prepared according to the composition ratio.

Herein, in preparing the ceramic base 120 (S110), to enhance the bonding force with the metal layer 140, the ceramic base 120 may have a fine protrusion formed on the surface thereof. In other words, in preparing the ceramic base 120 (S110), the ceramic base 120 is subjected to chemical treatment using chemicals or physical treatment such as grinding, sand blasting, and the like to have an uneven surface on which the fine protrusion is formed. Any other example for forming the uneven surface of the ceramic base 120 may be possible.

In forming the metal layer 140 (S130), the metal layer 140 is formed on at least one surface of the ceramic base 120. Herein, in forming the metal layer 140 (S130), the metal layer 140 is formed by bonding a metal thin film to the at least one surface of the ceramic base 120. In forming the metal layer 140 (S130), the metal layer 140 is formed to entirely cover the at least one surface of the ceramic base 120.

In forming the metal layer 140 (S130), the metal layer 140 may be formed by bonding the metal thin film such as a copper foil on a surface of the ceramic base 120 through brazing. The metal layer 140 may be formed by providing a bonding layer interposed between the ceramic base 120 and the metal thin film.

In forming the metal layer 140 (S130), the metal layer 140 may be formed by bonding on the surface of the ceramic base 120 a metal thin film or mixed metal thin film containing any one of copper (Cu) powder, silver (Ag) powder, aluminum (Al) powder, nickel (Ni) powder, tin (Sn) powder, and phosphorus (P) powder.

In forming the metal layer 140 (S130), the metal layer 140 may be formed by bonding a mixed metal thin film such as TiCu, NiTi, NiNb, CuMo, TiAg, and the like to the surface of the ceramic base 120.

In forming the mask 160 (S150), the mask 160 is formed the surface of the metal layer 140. Herein, in forming the mask 160 (S150), the mask 160 (for example, a dry film) being smaller in area than the ceramic base 120 and the metal layer 140 is positioned on the surface of the metal layer 140. In forming the mask 160 (S150), the boundary surface of the metal layer 140 and the boundary surface of the mask 160 are positioned to be spaced apart from each other such that the mask 160 is positioned inwardly on the surface of the metal layer 140. In forming the mask 160 (S150), the positioned mask 160 is subjected to exposure and curing, thus forming a mask 160 on the surface of the metal layer 140.

In forming the inclined protrusion 142 (S170), the metal layer 140 is subjected to etching to form the inclined protrusion 142 on the boundary surface thereof. Herein, in forming the inclined protrusion 142 (S170), a portion of the metal layer 140 (that is, the boundary surface of the metal layer 140) which is exposed by the mask 160 is subjected to etching with an etching solution (for example, ferric chloride ($FeCl_3$), thus forming an inclined protrusion 142 inclinedly extending downward from the upper to the lower edge of the metal layer 140 toward the outside end of the ceramic base 120.

In forming the inclined protrusion 142 (S170), when etching is performed at the same concentration, time, and rate (degree) as a basic ceramic AMB substrate according to the related art, the boundary surface of the metal layer 140 is inclined inwardly.

Accordingly, in forming the inclined protrusion 142 (S170), it is preferable that etching of the boundary surface of the metal layer 140 is performed using an etching solution having a concentration lower than that of an etching solution used in manufacturing the basic ceramic AMB substrate, or at a short etching time, or at a low etching rate (degree).

Thus, when the etching degree of the basic ceramic AMB substrate is assumed to be 100%, the inclined protrusion 142 is formed according to an etching degree of approximately 85% in forming the inclined protrusion 142 (S170).

Furthermore, in forming the inclined protrusion 142 (S170), etching of the boundary surface of the metal layer 140 may be performed at a slower etching rate than the etching rate at the time of manufacturing the basic ceramic AMB substrate, or etching of the boundary surface of the metal layer 140 may be performed with a shorter etching time than the etching time at the time of manufacturing the basic ceramic AMB substrate.

In forming the inclined protrusion 142 (S170), an inclined protrusion 142, which inclinedly extends from the upper edge of the metal layer 140 to protrude toward the outside end of the ceramic base 120 on the basis of a virtual line perpendicular to the ceramic substrate 100 and has a curved inclination, is formed.

In forming the inclined protrusion 142 (S170), the inclined protrusion 142 is formed to have a length of equal to or less than approximately one half of the thickness of the metal layer 140.

In removing the mask 160 (S190), the mask 160 positioned on the surface of the metal layer 140 is subjected to etching with the etching solution after the inclined protrusion 142 is formed on the metal layer 140. As a result, the mask 160 is removed in removing the mask 160 (S190), thus manufacturing a final ceramic substrate 100.

Figure 13:
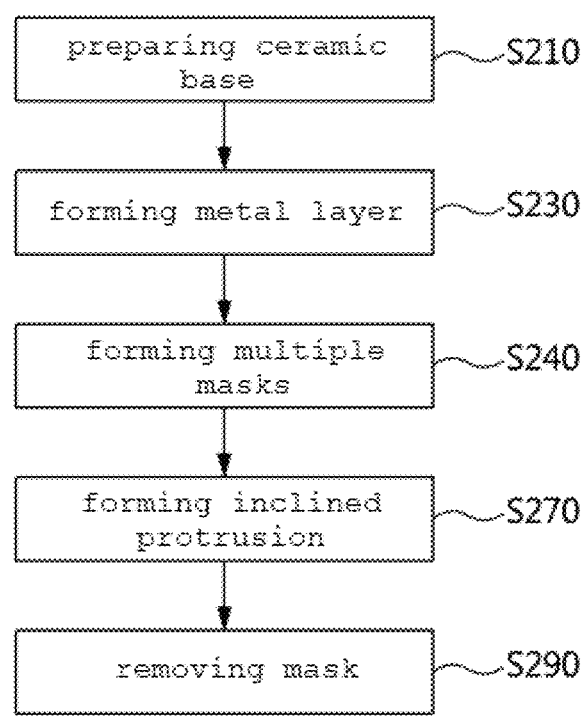
FIGS. 13 and 14 are views showing a manufacturing method for a ceramic substrate according to a second embodiment of the present invention.
Figure 14:
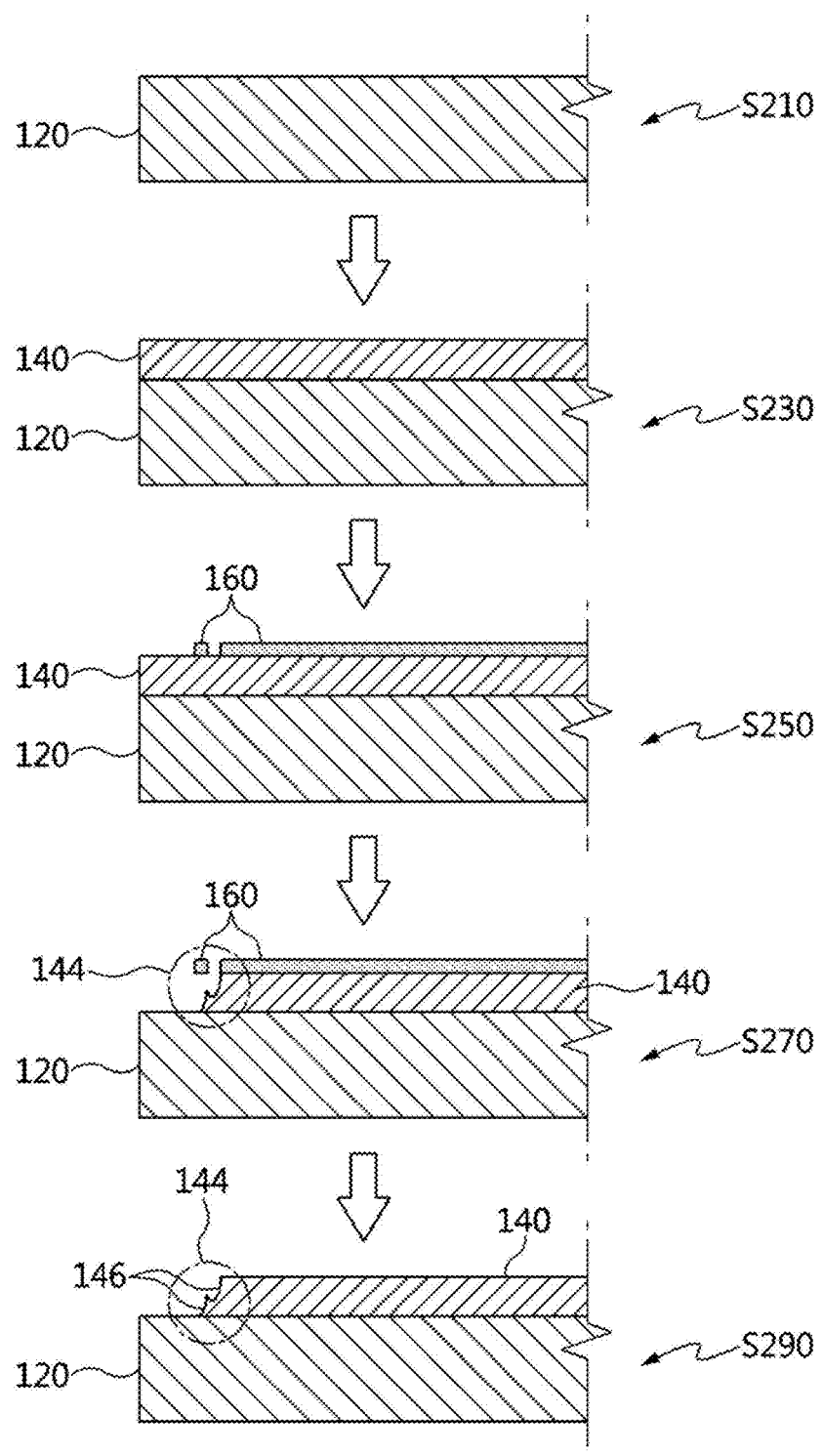

Referring to FIGS. 13 and 14, a manufacturing method for a ceramic substrate according to a second embodiment of the present invention includes preparing a ceramic base 120 (S210), forming a metal layer 140 (S230), forming a mask 160 (S250), forming an inclined protrusion 144 (S270), and removing the mask 160 (S290). Herein, preparing the ceramic base 120 (S210) and forming the metal layer 140 (S230) are the same as preparing the ceramic base 120 (S110) and forming the metal layer 140 (S130) of the manufacturing method for the ceramic substrate 100 according to the first embodiment, so a detailed description thereof will be omitted.

In forming the mask 160 (S250), multiple masks 160 are formed on a surface of the metal layer 140. In other words, in forming the mask 160 (S250), at least two masks 160 are formed the surface of the metal layer 140 to form an inclined protrusion 144 having a concave portion 146.

Figure 19:
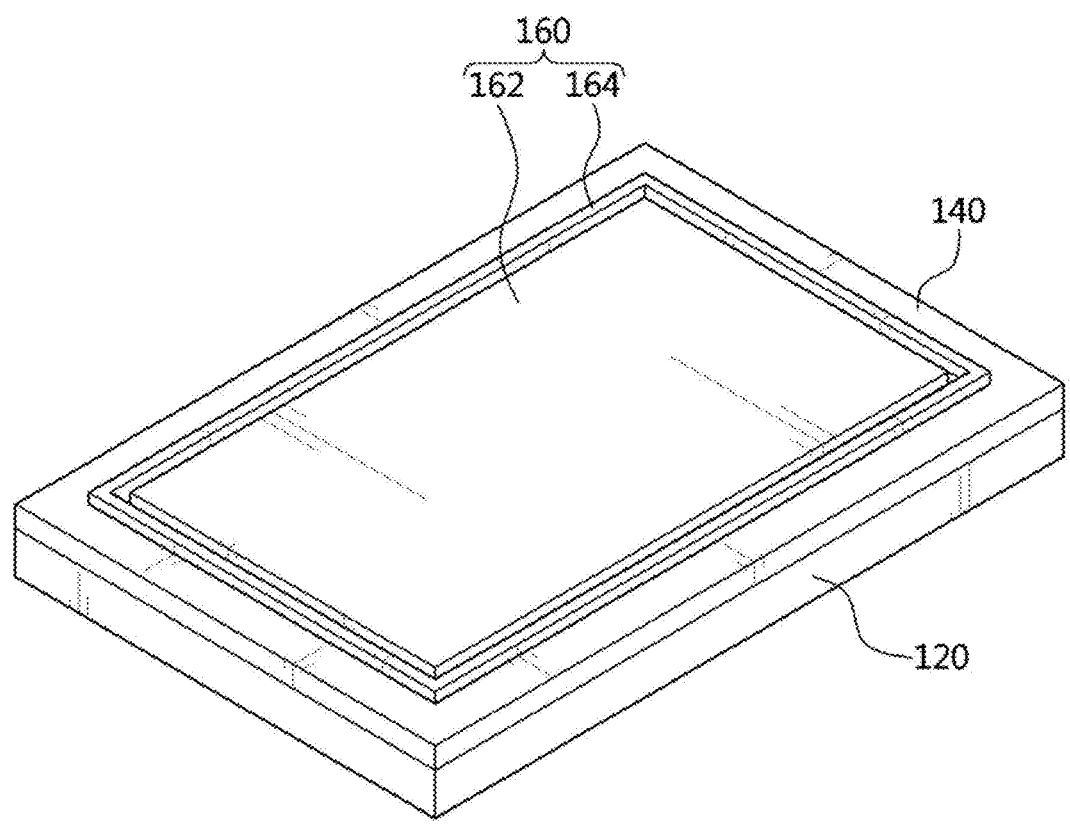
FIGS. 19 and 20 are views showing forming of a mask of FIGS. 13, 15, and 17.

As an example, as shown in FIG. 19, in forming the mask 160 (S250), a first mask 162 and a second mask 164, which are smaller in area than the ceramic base 120 and the metal layer 140, are positioned on the surface of the metal layer 140. Herein, the first mask 162 is formed as a thin film having a predetermined area, and the second mask 164 is formed as a thin film having a predetermined area with an insertion hole into which the first mask 162 is inserted.

Figure 20:
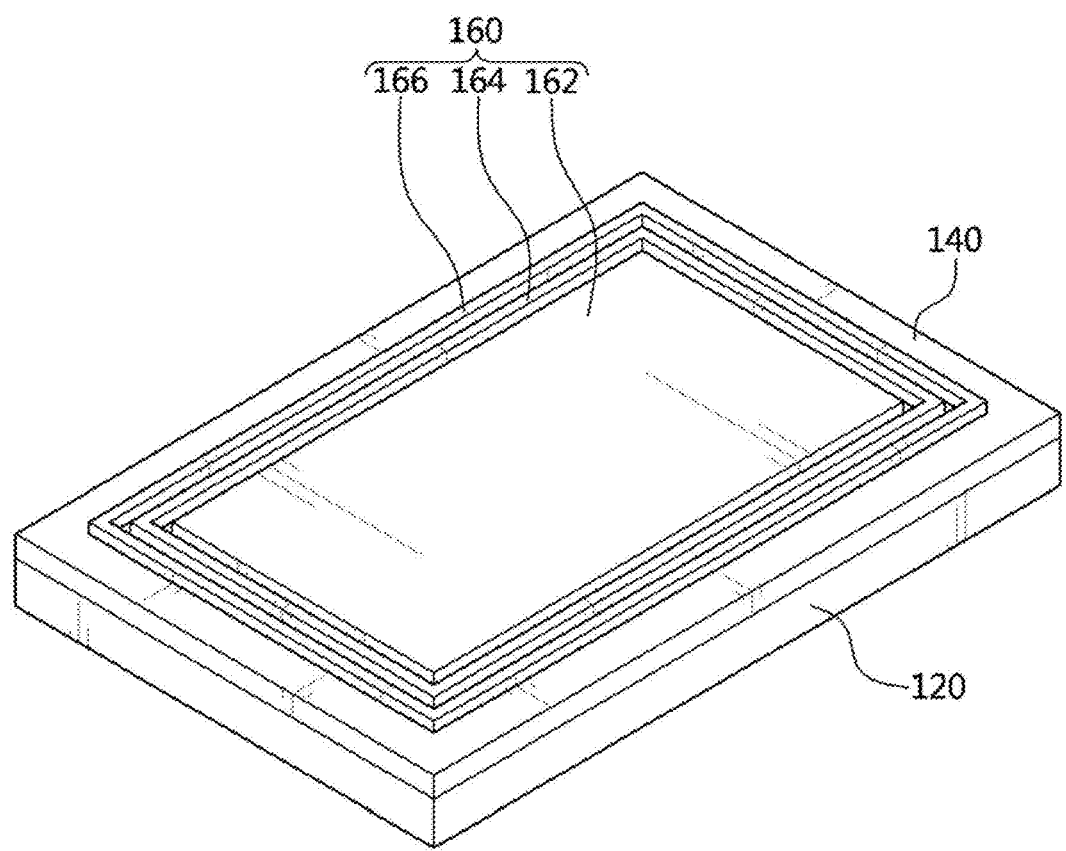
Figure 25:
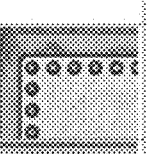

As another example, as shown in FIG. 20, in forming the mask 160 (S250), a first mask 162, a second mask 164, and a third mask 166, which are smaller in area than the ceramic base 120 and the metal layer 140, are positioned on the surface of the metal layer 140. Herein, the first mask 162 is formed as a thin film having a predetermined area, and the second mask 164 is formed as a thin film having a predetermined area with a first insertion hole into which the first mask 162 is inserted. The third mask 166 is formed as a thin film having a predetermined area with a second insertion hole into which the first mask 162 and the second mask 164 are inserted.

Herein, in forming the mask 160 (S250), the outermost mask 160 (for example, the second mask 164 or the third mask 166) and the boundary surface of the metal layer 140 are positioned to be spaced apart from each other, such that the mask 160 is positioned inwardly on the surface of the metal layer 140.

In forming the mask 160 (S250), the positioned mask 160 is subjected to exposure and curing to form a mask 160 (that is, the first mask 162, the second mask 164, and the third mask 166) on the surface of the metal layer 140.

In forming the inclined protrusion 144 (S270), the metal layer 140 is subjected to etching to form the inclined protrusion 144 on the boundary surface thereof. Herein, in forming the inclined protrusion 144 (S270), a portion of the metal layer 140 which is exposed by the mask 160 (that is, a space defined between the boundary surface of the metal layer 140 and the mask 160) is subjected to etching, thus forming an inclined protrusion 144 inclinedly extending downward from the upper to the lower edge of the metal layer 140 toward the outside end of the ceramic base 120. Herein, in forming the inclined protrusion 144 (S270), an inclined protrusion 144 having at least one concave portion 146 is formed.

As an example, in forming the inclined protrusion 144 (S270), when the first mask 162 and the second mask 164 are formed in forming the mask (S250), a portion of the metal layer 140 which corresponds to a space defined between the first mask 162 and the second mask 164 is subjected to etching with an etching solution, and portions of the metal layer 140 which correspond to opposite sides of the second mask 164 are subjected to etching with the etching solution, thus forming an inclined protrusion 144 having two concave portions 146 on the boundary surface of the metal layer 140.

As another example, in forming the inclined protrusion 144 (S270), when the first mask 162 to the third mask 166 are formed in forming the mask (S250), portions of the metal layer 140 which correspond to the space defined between the first mask 162 and the second mask 164 and a space defined between the second mask 164 and the third mask 166 are subjected to etching with an etching solution, and portions of the metal layer 140 which correspond to opposite sides of the second mask 164 and the third mask 166 are subjected to etching with the etching solution, thus forming an inclined protrusion 144 having three concave portions 146 on the boundary surface of the metal layer 140.

In forming the inclined protrusion 144 (S270), an inclined protrusion 142, which inclinedly extends from the upper edge of the metal layer 140 to protrude toward the outside end of the ceramic base 120 on the basis of a virtual line perpendicular to the ceramic substrate 100 and has a curved inclination, is formed. In forming the inclined protrusion 142 (S170), the inclined protrusion 142 is formed to have a length of equal to or less than approximately one half of the thickness of the metal layer 140.

In removing the mask 160 (S290), the mask 160 positioned on the surface of the metal layer 140 is subjected to etching with the etching solution after the inclined protrusion 144 is formed on the metal layer 140. As a result, the mask 160 is removed in removing the mask 160 (S290), thus manufacturing a final ceramic substrate 100.

Figure 15:
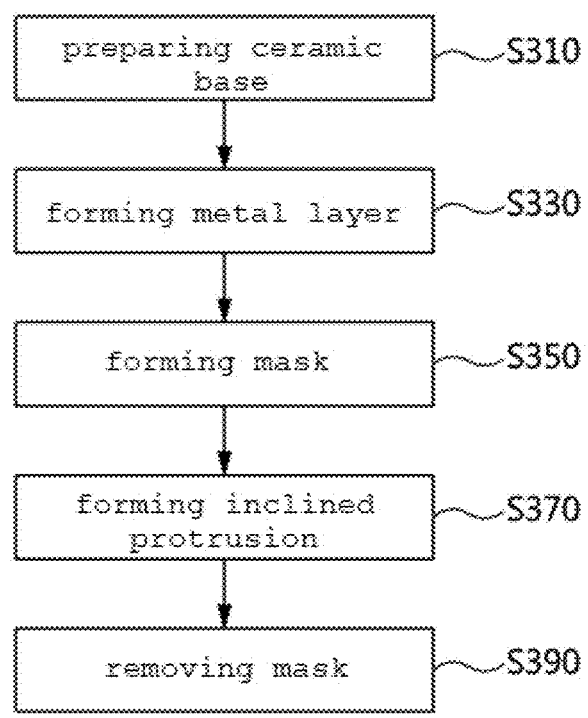
FIGS. 15 and 16 are views showing a manufacturing method for a ceramic substrate according to a third embodiment of the present invention.
Figure 16:
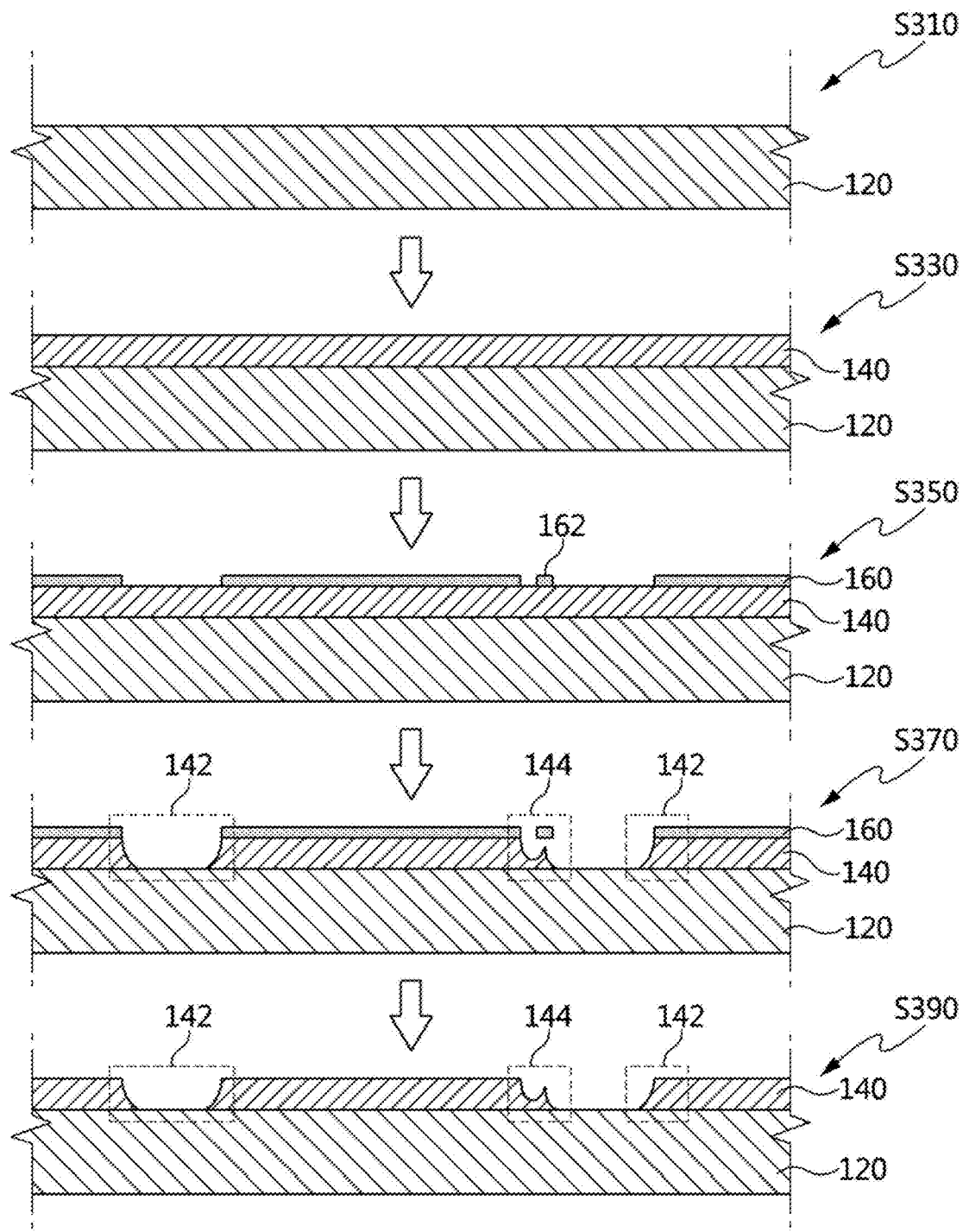

Referring to FIGS. 15 and 16, a manufacturing method for a ceramic substrate according to a third embodiment of the present invention includes preparing a ceramic base 120 (S310), forming a metal layer 140 (S330), forming a mask 160 (S350), forming inclined protrusions 142 and 144 (S370), and removing the mask 160 (S390). Herein, preparing the ceramic base 120 (S310) and forming the metal layer 140 (S330) are the same as preparing the ceramic base 120 (S110) and forming the metal layer 140 (S130) of the manufacturing method for the ceramic substrate 100 according to the first embodiment, so a detailed description thereof will be omitted.

In forming the mask 160 (S350), multiple masks 160 are formed on a surface of the metal layer 140. In other words, in forming the mask 160 (S350), the multiple masks 160 are arranged on the ceramic base 120 according to a desired pattern shape. Herein, the boundary surface of the metal layer 140 and the boundary surface of each mask 160 are positioned to be spaced apart from each other such that the multiple masks 160 are positioned inwardly on the surface of the metal layer 140. In forming the mask 160 (S350), the positioned multiple masks 160 are subjected to etching and curing, thus forming multiple masks 160 on the surface of the metal layer 140.

In forming the mask 160 (S350), the multiple masks 160 (for example, a dry film) being smaller in area than the ceramic base 120 and the metal layer 140 are positioned on the surface of the metal layer 140. The multiple masks 160 are each formed in a predetermined shape to form an independent metal layer 140 and are positioned to be spaced apart from each other by a predetermined interval.

Herein, in forming the mask 160 (S350), a sub-mask 162 is positioned to be spaced apart from the mask 160 at a position where a multi-stepped protrusion 144 is formed according to an interval between patterns formed by the mask 160. Herein, forming the mask 160 (S350) and forming the mask (S250) described above are the same in arrangement of the first and second masks 162 and 164 or in arrangement of the first, second, and third masks 162, 164, and 166 as shown in FIGS. 19 and 20, so a detailed description thereof will be omitted.

In forming the inclined protrusions (S370), the metal layer 140 is subjected to etching to form a tapered protrusion 142 on the boundary surface thereof. In other words, in forming the inclined protrusions (S370), a portion of the metal layer 140 exposed by the multiple of masks 160 is subjected to etching with an etching solution (for example, ferric chloride ($FeCl_3$)) to form a tapered protrusion 142 inclinedly extending downward from the upper to the lower edge of the metal layer 140 toward the outside end of the ceramic base 120.

In forming the inclined protrusions (S370), when etching is performed at the same concentration, time, and rate (degree) as a basic ceramic AMB substrate according to the related art, the boundary surface of the metal layer 140 is formed to be inclined inwardly.

Accordingly, in forming the inclined protrusions (S370), it is preferable that etching of the boundary surface of the metal layer 140 is performed using an etching solution having a concentration lower than that of an etching solution used in manufacturing the basic ceramic AMB substrate, or at a short etching time, or at a low etching rate (degree).

Thus, when the etching degree of the basic ceramic AMB substrate is assumed to be 100%, the tapered protrusion 142 is formed according to an etching degree of approximately 85% in forming the inclined protrusions (S370).

Furthermore, in forming the inclined protrusions (S370), etching of the boundary surface of the metal layer 140 may be performed at a slower etching rate than the etching rate at the time of manufacturing the basic ceramic AMB substrate, or etching of the boundary surface of the metal layer 140 may be performed with a shorter etching time than the etching time at the time of manufacturing the basic ceramic AMB substrate.

In forming the inclined protrusions (S370), a tapered protrusion 142, which inclinedly extends from the upper edge of the metal layer 140 to protrude toward the outside end of the ceramic base 120 on the basis of a virtual line perpendicular to the ceramic substrate 100 and has a curved inclination, is formed.

In forming the inclined protrusions (S370), the tapered protrusion 142 is formed to have a length of equal to or less than approximately one half of the thickness of the metal layer 140.

Meanwhile, in forming the inclined protrusions (S370), a multi-stepped protrusion 144 having at least one concave portion is formed. In other words, in forming the inclined protrusions (S370), a portion of the metal layer 140 which corresponds to a space defined between the mask 160 and the sub-mask 162 is subjected to etching with an etching solution, and portions of the metal layer 140 which correspond to opposite sides of the sub-mask 162 are subjected to etching with the etching solution, thus forming a multi-stepped protrusion 144 having two concave portions on the boundary surface of the metal layer 140.

In removing the mask 160 (S390), the mask 160 positioned on the surface of the metal layer 140 is subjected to etching with the etching solution after the tapered protrusion 142 and the multi-stepped protrusion 144 are formed on the metal layer 140. As a result, the mask 160 is removed in removing the mask 160 (S390), thus manufacturing a final ceramic substrate 100.

Figure 17:
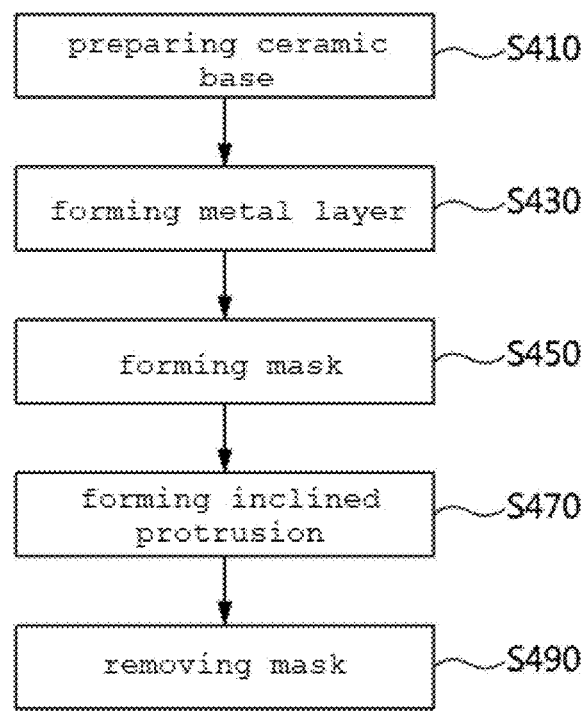
FIGS. 17 and 18 are views showing a manufacturing method for a ceramic substrate according to a fourth embodiment of the present invention.
Figure 18:
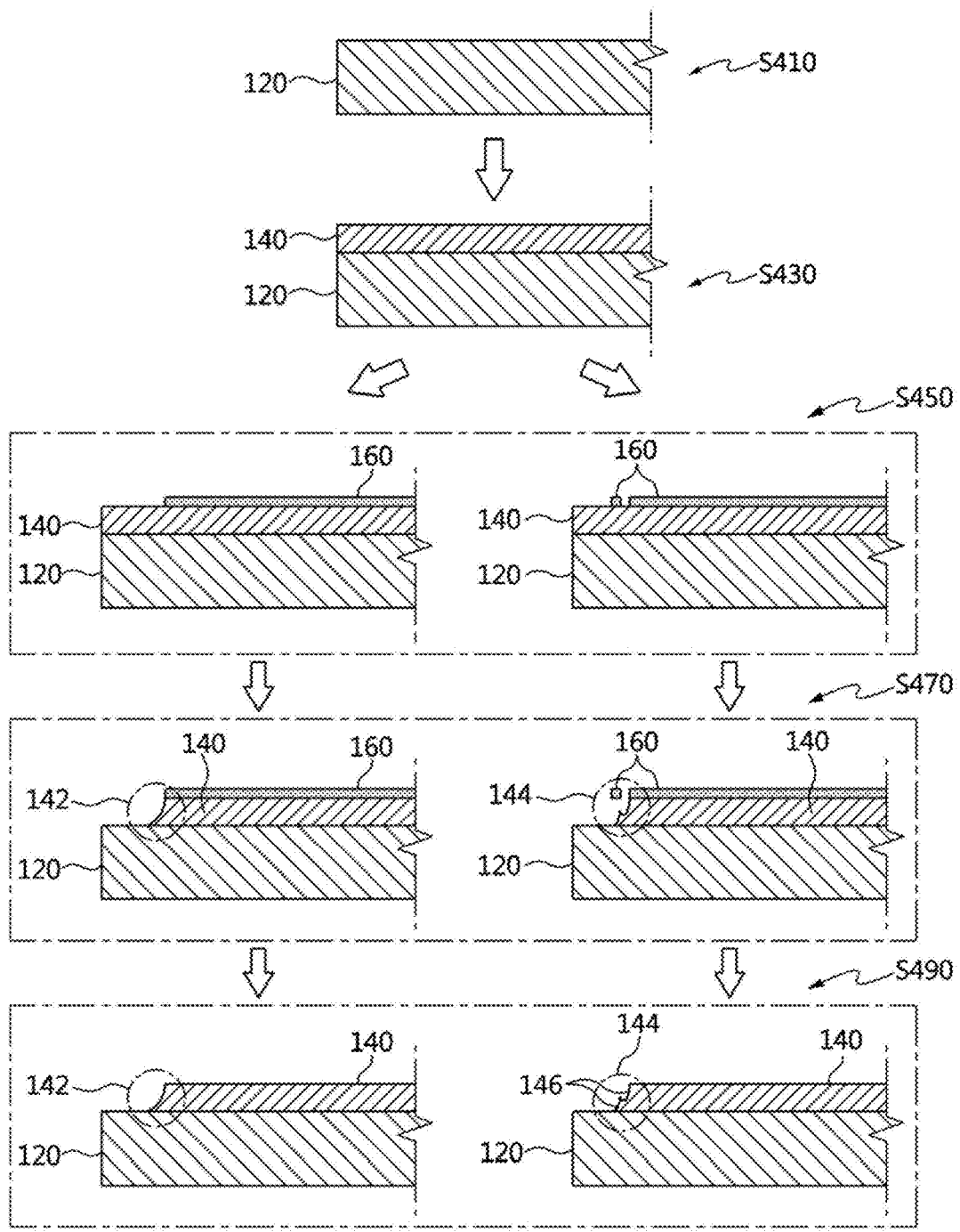

Referring to FIGS. 17 and 18, a manufacturing method for a ceramic substrate according to a fourth embodiment of the present invention includes preparing a ceramic base 120 (S410), forming a metal layer 140 (S430), forming a mask 160 (S450), forming inclined protrusions 142 and 144 (S470), and removing the mask 160 (S490). Herein, preparing the ceramic base 120 (S410) and forming the metal layer 140 (S430) are the same as preparing the ceramic base 120 (S110) and forming the metal layer 140 (S130) of the manufacturing method for the ceramic substrate 100 according to the first embodiment, so a detailed description thereof will be omitted.

In forming the mask 160 (S450), the mask 160 is formed the surface of the metal layer 140. Herein, in forming the mask 160 (S450), the mask 160 (for example, a dry film) being smaller in area than the metal layer 140 is positioned on the surface of the metal layer 140 to form a tapered protrusion 142. In forming the mask 160 (S450), the boundary surface of the metal layer 140 and the boundary surface of the mask 160 are positioned to be spaced apart from each other such that the mask 160 is positioned inwardly on the surface of the metal layer 140.

Meanwhile, in forming the mask 160 (S450), multiple masks 160 may be formed on the surface of the metal layer 140. In other words, in forming the mask 160 (S450), at least two masks 160 may be formed on the surface of the metal layer 140 to form a multi-stepped protrusion 144.

In forming the mask 160 (S450), the positioned mask 160 is subjected to exposure and curing to from a mask 160 on the surface of the metal layer 140. Herein, in forming the mask 160 (S450), a mask 160 for forming the multi-stepped protrusion 144 may be formed, the multi-stepped protrusion being relatively thin and being formed on a portion of the boundary surface of the metal layer 140 at a position corresponding to the short edge, apex, corner, and the like, while a mask 160 for forming the tapered protrusion 142 may be formed, the tapered protrusion being formed on a remaining portion of the boundary surface of the metal layer. Herein, forming the mask 160 (S450) and forming the mask (S250) described above are the same in arrangement of the first and second masks 162 and 164 or in arrangement of the first, second, and third masks 162, 164, and 166 as shown in FIGS. 19 and 20, so a detailed description thereof will be omitted.

In forming the inclined protrusions 142 and 144 (S470), the metal layer 140 is subjected to etching to form the inclined protrusions 142 and 144 on the boundary surface thereof Herein, in forming the inclined protrusions 142 and 144 (S470), a portion of the metal layer 140 exposed by the mask 160 (that is, the boundary surface of the metal layer 140) is subjected to etching with an etching solution (for example, ferric chloride ($FeCl_3$)) to form inclined protrusions 142 and 144 inclinedly extending downward from the upper to the lower edge of the metal layer 140 toward the outside end of the ceramic base 120.

In forming the inclined protrusions 142 and 144 (S470), at least one of the tapered protrusion 142 and the multi-stepped protrusion 144 is formed on the boundary surface of the metal layer 140. In other words, in forming the inclined protrusions 142 and 144 (S470), a tapered protrusion 142, which inclinedly extends from the upper edge of the metal layer 140 to protrude toward the outside end of the ceramic base 120 on the basis of a virtual line perpendicular to the ceramic substrate 100 and has a curved inclination, is formed, or a multi-stepped protrusion 144 having multiple concave portions 146 is formed.

Herein, in forming the inclined protrusions (S470), the multi-stepped protrusion 144 may be formed on a portion of the boundary surface of the metal layer where the bonding stress is concentrated, while the tapered protrusion 142 may be formed on a remaining portion of the boundary surface of the metal layer. In other words, the bonding stress is concentrated on portions 148 of the metal layer 140, such as the short edge, apex, corner, and the like. Because of this, in forming the inclined protrusions (S470), the multi-stepped protrusion 144 being relatively thin is formed on the portion of the boundary surface of the metal layer 140 at a position corresponding to the short edge, the apex, the corner, and the like. In forming the inclined protrusions (S470), the tapered protrusion 142 is formed on the remaining portion (for example, the long edge) of the boundary surface of the metal layer where relatively small bonding stress is applied.

In forming the inclined protrusions (S470), when etching is performed at the same concentration, time, and rate (degree) as a basic ceramic AMB substrate according to the related art, the boundary surface of the metal layer 140 is rounded inwardly.

Accordingly, in forming the inclined protrusions (S470), it is preferable that etching of the boundary surface of the metal layer 140 is performed using an etching solution having a concentration lower than that of an etching solution used in manufacturing the basic ceramic AMB substrate, or with a short etching time, or at a low etching rate (degree).

Thus, when the etching degree of the basic ceramic AMB substrate is assumed to be 100%, the inclined protrusions are formed according to an etching degree of approximately 85% in forming the inclined protrusions (S470).

Furthermore, in forming the inclined protrusions (S470), etching of the boundary surface of the metal layer 140 may be performed at a slower etching rate than the etching rate at the time of manufacturing the basic ceramic AMB substrate, or etching of the boundary surface of the metal layer 140 may be performed with a shorter etching time than the etching time at the time of manufacturing the basic ceramic AMB substrate.

In forming the inclined protrusions (S470), inclined protrusions having an inclination angle within a predetermined angle range with respect to the ceramic base 120 are formed. Herein, the inclination angle may be an angle between the surface of the ceramic base 120 and a line connecting two points where the tapered protrusion 142 is in contact with the metal layer 140 and the ceramic base 120 or an angle between the surface of the ceramic base 120 and a line connecting a point where the multi-stepped protrusion 144 is in contact with the ceramic base 120 and an apex of a protrusion formed between the concave portions 146.

The metal layer 140 increases in bonding stress with the ceramic base 120 as the boundary surface of the metal layer increases in thickness. If the bonding stress increases, the metal layer 140 may be delaminated from the ceramic base 120 under a rapid temperature change.

To prevent delamination of the metal layer 140 from the ceramic base 120, the bonding stress must be minimized while the bonding strength is maintained. Because of this, the inclined protrusions 142 and 144 having the inclination angle within the predetermined angle range with the ceramic base 120 are formed on the boundary surface of the metal layer 140, thus achieving a minimized thickness.

Herein, to minimize the bonding stress, the inclined protrusions 142 and 144 are formed to have an inclination angle $\theta$ of equal to or less than approximately 33° with respect to the ceramic base 120. In this case, if the inclination angle is set to be too low, the bonding strength may decrease, causing the inclined protrusions 142 and 144 to be delaminated from the ceramic base 120. Accordingly, to minimize the bonding stress, it is preferable that the multi-stepped protrusion 144 is formed to have an inclination angle $\theta$ ranging from equal to or greater than approximately 27° to equal to or less than 33° with respect to the ceramic base 120.

In removing the mask 160 (S490), the mask 160 positioned on the surface of the metal layer 140 is subjected to etching with the etching solution after the inclined protrusions are formed on the metal layer 140. As a result, the mask 160 is removed in removing the mask 160 (S490), thus manufacturing a final ceramic substrate 100.

In order to test the crack resistance and delamination resistance of the ceramic AMB substrate, as shown in FIG. 21, a thermal shock test was conducted using a first ceramic AMB substrate to a fourth ceramic AMB substrate having different configurations.

The first ceramic AMB substrate includes a ceramic base having a composition ratio of ZTA of approximately 9% and having a thickness of about 0.32 mm, and a metal layer having a thickness of approximately 0.3 mm and made of electrolytic tough pitch copper (ETP). The second ceramic AMB substrate includes a ceramic base made of aluminum nitride (AN) and having a thickness of approximately 0.64 mm, and a metal layer having a thickness of approximately 0.3 mm and made of oxygen free copper (OFC). The third ceramic AMB substrate includes a ceramic base made of aluminum oxide ($Al_2O_3$) and having a thickness of approximately 0.5 mm, and a metal layer made of the OFC and having a thickness of approximately 0.3 mm. The fourth ceramic AMB substrate includes a ceramic base having a composition ratio of ZTA Of approximately 15% and having a thickness of approximately 0.32 mm, and a metal layer made of the OFC and having a thickness of approximately 0.3 mm.

Referring to FIGS. 22 to 25, the metal layers of the first ceramic AMB substrate to the fourth ceramic AMB substrate were respectively formed in a dimple type, a tapered type, a 1-step and a 2-step, and the thermal shock test was conducted. As a result, it can be found that both the case where the dimple type according to the related art is applied and the case where the shape of the metal layer (that is, the tapered type, the 1-step, and the 2-step) according to the embodiment of the present invention is applied did not undergo occurrence of internal cracking and delamination until 600 cycles. Herein, the tapered type denotes a metal layer on which an inclined protrusion is formed, the 1-step denotes a metal layer on which an inclined protrusion having two concave portions is formed, and the 2-step denotes a metal layer on which an inclined protrusion having three concave portions is formed.

Thus, it can be seen that the ceramic substrate according to the embodiment of the present invention has the same level of crack resistance and delamination resistance as a dimple-type ceramic AMB substrate according to the related art.

However, the dimple-type ceramic AMB substrate according to the related art requires provision of multiple dimples in order to prevent internal cracking and delamination. Because of this, the metal layer decreases in area, leading to a degradation in electrical characteristics such as electric conductivity, thermal resistance, and the like.

Conversely, the ceramic substrate according to the embodiment of the present invention is advantageous over the dimple-type ceramic AMB substrate according to the related art in that the metal layer is increased in area, leading to improvement in electric characteristics such as electric conductivity, thermal resistance, and the like while realizing the same level of crack resistance and delamination resistance as the dimple-type ceramic AMB substrate according to the related art.

Furthermore, in the dimple-type ceramic AMB substrate according to the related art, when the dimples are formed only in a portion of the metal layer in order to prevent degradation in electrical characteristics, a portion of the metal layer having no dimples may undergo cracking or delamination from the ceramic base under at a rapid temperature change.

Conversely, the ceramic substrate according to the embodiment of the present invention is advantageous over the dimple-type ceramic AMB substrate according to the related art in that the area thereof is relatively large. Because of this, when electrical characteristics thereof are the same, it is possible to realize relatively high crack and delamination resistance.

Furthermore, in the dimple-type ceramic AMB substrate according to the related art, the dimples have a high area ratio, leading to an increase in resistance and a decrease in strength and in bonding strength between the ceramic base and the metal layer. Furthermore, the dimple-type ceramic AMB substrate does not find application in forming of a micro-scale pattern.

Conversely, the ceramic substrate according to the embodiment of the present invention is advantageous over the dimple-type ceramic AMB substrate according to the related art in that the area thereof is relatively large, making it possible to strongly maintain the strength and bonding strength and find application in forming of a micro-scale pattern.

As described above, in the ceramic substrate and the manufacturing method therefor according to the embodiment of the present invention are advantageous over the dimple-type ceramic AMB substrate according to the related art in terms of securing reliability while providing a prolonged lifespan.

Furthermore, in the ceramic substrate and the manufacturing method therefor according to the embodiment of the present invention, controlling an etching pattern of the mask (that is, a dry film) is possible upon forming the inclined protrusion, thus making it unnecessary to perform additional etching two or three times and thus leading to a reduction in post-processing cost.

Furthermore, in the ceramic substrate and the manufacturing method therefor according to the embodiment of the present invention, forming the inclined protrusion in the metal makes it possible to disperse energy on the boundary surface of the metal layer, thus improving long-term reliability of an AMB insulated gate bipolar mode transistor (IGBT) substrate.

Furthermore, in the ceramic substrate and the manufacturing method therefor according to another embodiment of the present invention, the multi-stepped protrusion, which has the inclination angle within the predetermined angle range with the ceramic base, is formed on the portion of the boundary surface of the metal layer where the stress is concentrated, such as the short edge, apex, corner, and the like, and the tapered protrusion is formed on the remaining portion of the boundary surface of the metal layer. Thus, it is possible to realize a desired thickness that minimizes the bonding stress while maintaining the bonding strength, thus preventing delamination of the metal layer from the ceramic base.

Although a preferred embodiment of the present invention has been described for illustrative purposes, those skilled in the art will appreciate that various modifications, additions and substitutions are possible, without departing from the scope and spirit of the invention as disclosed in the accompanying claims.

INDUSTRIAL APPLICABILITY

The present invention relates to a ceramic substrate and a manufacturing method therefor. The present invention is advantageous over a dimple-type ceramic AMB substrate in that it is possible to overcome a degradation in electrical characteristics such as electrical conductivity, thermal resistance, and the like due to a decrease in area of a metal layer and to secure reliability while providing a prolonged lifespan.

The ceramic substrate according to an embodiment of the present invention can be used as a substrate having stable and excellent electrical characteristics for energy storage, transportation, and power generation in various industrial fields, such as vehicles, wind turbines, high voltage and long distance DC transmission.

The invention claimed is:

1. A ceramic substrate, comprising:
   a ceramic base; and
   a metal layer bonded to at least one surface of the ceramic base,
   wherein the metal layer has an inclined protrusion formed on a boundary surface thereof,
   wherein the inclined protrusion has multiple consecutive concave portions, and
   wherein the inclined protrusion has a pointed protrusion formed at a portion where each of the concave portion and a neighboring concave portion are in contact with each other.

2. The ceramic substrate of claim 1, wherein the inclined protrusion inclinedly extends from an upper edge of the metal layer to protrude toward an outside end of the ceramic base through a virtual line which is perpendicular to the ceramic substrate.

3. The ceramic substrate of claim 1, wherein the inclined protrusion increases in protruding length toward the ceramic base.

4. The ceramic substrate of claim 1, wherein the inclined protrusion is formed in a shape concaved toward the ceramic base.

5. The ceramic substrate of claim 1, wherein the inclined protrusion is formed to have a protruding length toward the ceramic base, the protruding length being shorter than a thickness of the metal layer.

6. The ceramic substrate of claim 1, wherein the inclined protrusion includes a tapered protrusion and a multi-stepped protrusion, and
   an interval between the boundary surface of the metal layer on which the tapered protrusion is formed and a neighboring metal layer is smaller than an interval between the boundary surface of the metal layer on which the multi-stepped protrusion is formed and the neighboring metal layer.

7. The ceramic substrate of claim 1, wherein when an interval between the metal layer and a neighboring metal layer is greater than a maximum set interval, a multi-stepped protrusion is formed on a portion of the boundary surface of the metal layer, the portion of the boundary surface facing the neighboring metal layer.

8. The ceramic substrate of claim 1, wherein when an interval between the metal layer and a neighboring metal layer is less than a minimum set interval, a tapered protrusion is formed on a portion of the boundary surface of the metal layer, the portion of the boundary surface facing the neighboring metal layer.

9. The ceramic substrate of claim 1, wherein when an interval between the metal layer and a neighboring metal layer ranges from equal to or greater than a minimum set interval to equal to or less than a maximum set interval, a tapered protrusion or multi-stepped protrusion is formed on a portion of the boundary surface of the metal layer, the portion of the boundary surface facing the neighboring metal layer.

10. The ceramic substrate of claim 9, wherein when the tapered protrusion is formed on the neighboring metal layer, the multi-stepped protrusion is formed on the portion of the boundary surface of the metal layer, the portion of the boundary surface facing the neighboring metal layer, and
when the multi-stepped protrusion is formed on the neighboring metal layer, the tapered protrusion is formed on the portion of the boundary surface of the metal layer, the portion of the boundary surface facing the neighboring metal layer.

11. The ceramic substrate of claim 1, wherein the inclined protrusion is formed on a portion of the boundary surface of the metal layer where stress is concentrated.

12. The ceramic substrate of claim 11, wherein the multi-stepped protrusion is formed on the portion of the boundary surface of the metal layer at a position corresponding to at least one of a short edge, a corner, and an apex of the metal layer.

13. The ceramic substrate of claim 11, wherein the multi-stepped protrusion has an inclination angle ranging from equal to or greater than 27° to equal to or less than 33°, and
the inclination angle is an angle between the surface of the ceramic base and a line connecting a point where the multi-stepped protrusion is in contact with the ceramic base and an apex of a protrusion formed between concave portions.

14. The ceramic substrate of claim 11, wherein the inclined protrusion further includes a tapered protrusion formed on a remaining portion of the boundary surface of the metal layer.

15. The ceramic substrate of claim 14, wherein the tapered protrusion has an inclination angle ranging from equal to or greater than 27° to equal to or less than 33°, and
the inclination angle is an angle between the surface of the ceramic base and a line connecting two points where the tapered protrusion is in contact with the metal layer and the ceramic base.

16. The ceramic substrate of claim 1, wherein the inclined protrusion has a curved inclination.

* * * * *